United States Patent
Kaneko et al.

(10) Patent No.: US 8,610,078 B2
(45) Date of Patent: Dec. 17, 2013

(54) RADIOLOGICAL IMAGE DETECTION APPARATUS AND METHOD OF MANUFACTURING THE SAME

(71) Applicant: Fujifilm Corporation, Tokyo (JP)

(72) Inventors: Yasuhisa Kaneko, Kanagawa (JP); Haruyasu Nakatsugawa, Kanagawa (JP); Keiichirou Sato, Kanagawa (JP); Makoto Kitada, Kanagawa (JP); Kei Miura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/928,525

(22) Filed: Jun. 27, 2013

(65) Prior Publication Data

US 2013/0284935 A1 Oct. 31, 2013

Related U.S. Application Data

(63) Continuation of application No. PCT/JP2011/062401, filed on May 30, 2011.

(30) Foreign Application Priority Data

Dec. 27, 2010 (JP) .................................. 2010-291388

(51) Int. Cl.
*G01T 1/20* (2006.01)
(52) U.S. Cl.
USPC ..................... 250/367; 250/361 R; 250/486.1
(58) Field of Classification Search
USPC ........... 250/361 R, 366, 367, 370.08, 370.11, 250/486.1, 487.1
See application file for complete search history.

(56) References Cited

U.S. PATENT DOCUMENTS

| 2004/0149929 | A1 | 8/2004 | Miyake |
| 2005/0051736 | A1 | 3/2005 | Isoda et al. |
| 2011/0248186 | A1* | 10/2011 | Kasai et al. ................ 250/483.1 |

FOREIGN PATENT DOCUMENTS

| JP | 2001-330677 A | 11/2001 |
| JP | 3333278 B2 | 7/2002 |
| JP | 2004-170406 A | 6/2004 |
| JP | 2005-069991 A | 3/2005 |
| JP | 2006-266936 A | 10/2006 |
| JP | 2007-325866 A | 12/2007 |
| JP | 2008-111789 A | 5/2008 |
| WO | 2010/061727 A1 | 6/2010 |
| WO | WO 2010061727 A1 * | 6/2010 |

OTHER PUBLICATIONS

Communication (PCT/ISA/237) dated Jul. 5, 2011, in counterpart Application No. PCT/JP2011/062401.
Office Action dated Dec. 4, 2012, issued by the Japanese Patent Office in counterpart Japanese Application No. 2010-291388.

* cited by examiner

Primary Examiner — Mark R Gaworecki
(74) Attorney, Agent, or Firm — Sughrue Mion, PLLC

(57) ABSTRACT

The X-ray image detection apparatus 1 includes: a scintillator panel 10 including a phosphor 200 that is formed on a support 101 and emits fluorescence by irradiation of radiation; and a photodetector 40 that detects the fluorescence emitted by the phosphor as an electric signal, wherein the phosphor 200 includes a columnar section 20 formed by growing crystals of a fluorescent material in a columnar shape, and a non-columnar section 25 provided between the columnar section 20 and the support 101 and has a porosity lower than that of the columnar section 20, and the scintillator panel 10 is disposed at the rear side of the photodetector 40 in a radiation travelling direction, and in the phosphor 200, the non-columnar section 25 is disposed at a side opposite to the photodetector side.

19 Claims, 7 Drawing Sheets

RADIOLOGICAL IMAGE DETECTION APPARATUS AND METHOD OF MANUFACTURING THE SAME

CROSS REFERENCE TO RELATED APPLICATION

This is a continuation of International Application No. PCT/JP2011/062401 filed on May 30, 2011, and claims priority from Japanese Patent Application No. 2010-291388, filed on Dec. 27, 2010, the entire disclosures of which are incorporated herein by reference.

TECHNICAL FIELD

The present invention relates to a radiological image detection apparatus used for, for example, an X-ray imaging device for medical use, and a method of manufacturing the same.

BACKGROUND ART

Recently, a digital radiography (DR) that uses an X-ray image detection apparatus such as a flat panel detector (FPD) for converting X-rays into digital data has been practically used. The X-ray image detection apparatus has been rapidly distributed since it has a merit in that an image may be immediately confirmed, as compared to a conventional computed radiography (CR) method that uses an imaging plate.

As the X-ray image detection apparatus, various types have been proposed. For example, there is an indirect conversion type which converts X-rays into visible light using a scintillator such as CsI:Tl, GOS($Gd_2O_2S$:Tb) first, and converts the converted light into electric charges which are accumulated in a semiconductor layer. The indirect inversion type X-ray image detection apparatus includes a scintillator and a photodetector having a semiconductor layer.

In such an X-ray image detection apparatus, for example, in a case of being used in a living body, it is preferable to lower the X-ray irradiation dose, and a scintillator with a high luminescence amount and an excellent sensitivity is required. Thus, in order to increase the luminescence amount in the vicinity of the photodetector, there is proposed an X-ray image detection apparatus configured such that a phosphor such as CsI is deposited on a glass substrate of the photodetector and X-rays are irradiated toward scintillator from the photodetector side (see, e.g., Patent Literatures 1 and 2).

Here, in theory, as the thickness of the crystal phase of the scintillator is increased, the sensitivity is improved. However, in practice, when the thickness of the crystal phase is increased beyond a limit, there is a problem in that light may be attenuated or disused when passing the scintillator and thus, sufficient sensitivity may not be obtained or blurring of an image may occur. For this reason, an aggregate of columnar crystals that guide light emitted from a phosphor is used (see, e.g., Patent Literature 3). Since the light is guided in the thickness direction of the panel of the scintillator by such columnar crystals and incident on the light director, the sharpness of a detection image is improved.

In order to enhance the adhesion of the columnar crystals and a support, it has been proposed that several cover layers made of a phosphor host are laminated and formed between the columnar crystal and the support so that the coverage rate of the support is 95% or more in Patent Literature 3. Patent Literature 3 presumes an imaging plate as described above and is not related to an FPD.

CITATION LIST

Patent Literature

Patent Literature 1: JP-B-3333278
Patent Literature 2: JP-A-2001-330677
Patent Literature 3: JP-A-2004-170406

SUMMARY OF INVENTION

Technical Problem

In a scintillator panel, the adhesion of the phosphor and the support is very important. Due to the difference in the amount of thermal expansion between the support and the phosphor, flexing of the support may be caused by temperature change or the heat emitted from a control unit assembled to the scintillator panel and the phosphor may be easily peeled out. In particular, in a case of a configuration in which X-rays are irradiated from the photodetector side to the scintillator, since a control unit that controls the driving of, for example, a switching element of a photodetector is provided at the scintillator side at the rear in the X-ray travelling direction rather than at the photodetector side at the front in the X-ray travelling direction, the thermal influence on the scintillator by the heat emission of the control unit is very high. In particular, in the case of the configuration in which X-rays are irradiated from the photodetector side to the scintillator or in the case of columnar crystals in which the contact area of the phosphor with the support is small, a high adhesion with the support is requested.

In a deliquescent phosphor, when the adhesion with the support is poor, it is probable that the sealability of a protective film that covers the phosphor may be degraded and the capability of the phosphor may be deteriorated. In addition, when the adhesion with the support is poor, the phosphor may be separated from the support at the time of shock of falling-down or the like, when direct shock is applied to the separated portion, the phosphor may be damaged. Further, when a substrate such as Al that reflects light is used as the support, the reflectivity in relation to the separated portion is degraded.

Here, the inventors of the present invention has get an idea of interposing, between the columnar crystals and the support, a phosphor layer that has an adhesion with the support and contributes to the reflection of light emitted from the columnar crystals. In order to improve the adhesion with the support, it is preferable that the coverage of the support by the phosphor layer is high. However, when the coverage is 100%, it is impossible to reflect the light within the phosphor layer and thus, the usable luminescence amount of the scintillator is reduced. Patent Literature 3 defines a mean coverage of the support without describing the reflection by the cover layer. However, it becomes important to define a configuration related to a thickness direction of the cover layer from the viewpoint of reflection by the cover layer.

From the foregoing, an object of the present invention is to provide a scintillator of a new configuration which preferably exhibits each of an adhesion of a support with a phosphor and a reflective property of light in a radiological image detection apparatus in which radiation is irradiated from the photodetector side to the scintillator.

Solution to Problem

A radiological image detection apparatus of the present invention includes a scintillator panel including a phosphor that is formed on a support and emits fluorescence by the irradiation of radiation, a photodetector configured to detect the fluorescence emitted by the scintillator as an electrical signal. The phosphor includes a columnar section formed by crystals of the phosphor growing in a columnar shape and a non-columnar section provided between the columnar section and the support and having a porosity lower than that of the columnar section. The scintillator panel is arranged at a rear side of the photodetector in a radiation travelling direction and, in the phosphor, the non-columnar section is disposed at a side opposite to the photodetector side.

A method of manufacturing a radiological image detection apparatus of the present invention is a manufacturing method of the above described radiological image detection apparatus, in which the crystals of the phosphor are deposited on the support by a vapor deposition method to form the columnar section columnar section and the non-columnar section of the phosphor on the support and at least one of conditions of a degree of vacuum, the temperature of the support and deposition rate when forming the columnar section is changed to form the non-columnar section.

DESCRIPTION OF EMBODIMENTS

An example of an X-ray image detection apparatus (radiological image detection apparatus) for explaining an embodiment of the invention will be described below with reference to FIGS. 1 to 6.

Constituents similar to those in the aforementioned configuration are referred to by the same numerals correspondingly, and description thereof will be omitted or simplified.

1. Overall Configuration

Figure 1:
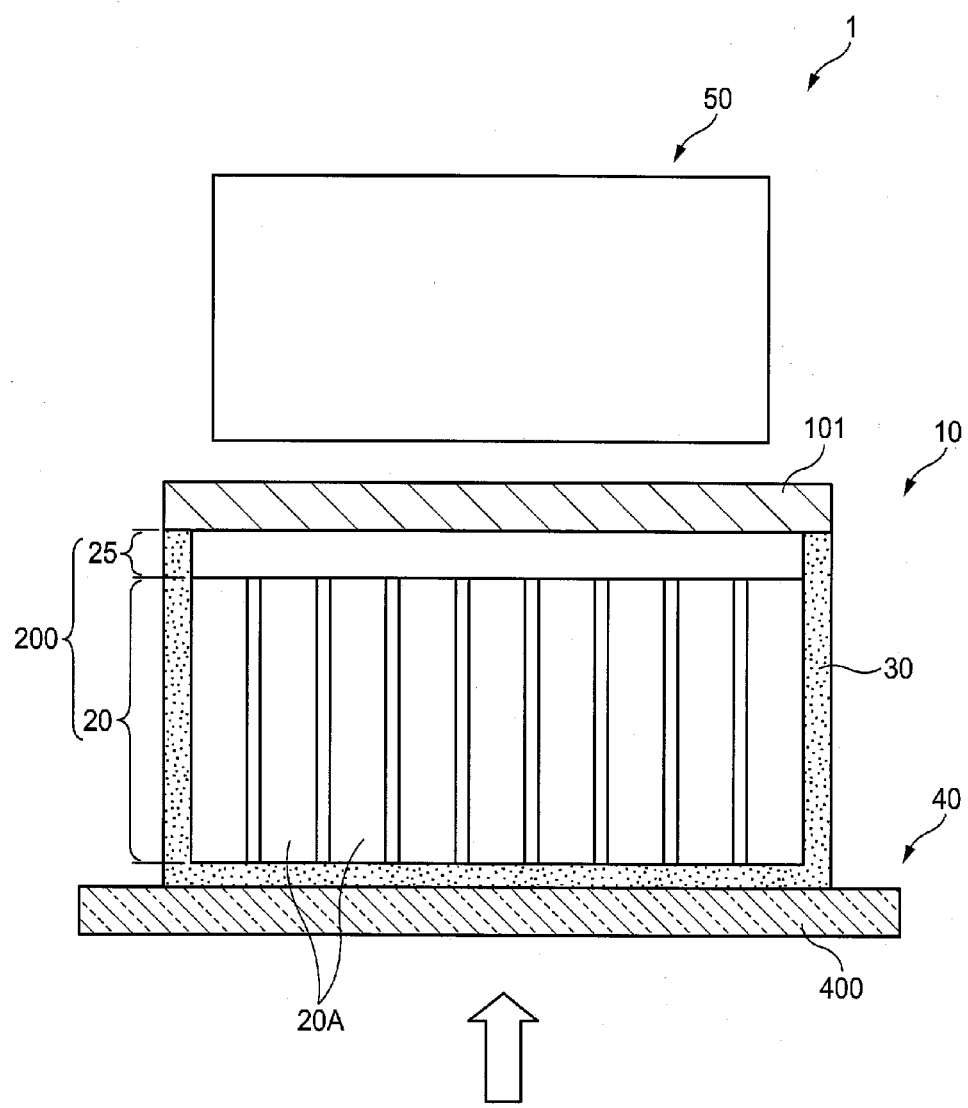
FIG. 1 is a side cross-sectional view schematically illustrating an outline configuration of an X-ray image detection apparatus.

FIG. 1 is a side cross-sectional view schematically illustrating an outline configuration of an indirect conversion type X-ray image detection apparatus 1. The X-ray image detection apparatus 1 is provided with a scintillator panel 10 including a phosphor 200 that emits light by the irradiation of X-rays, and a photodetector 40 that detects the light emitted from the phosphor 200 as an electrical signal.

As indicated by outline arrow of FIG. 1, in the X-ray image detection apparatus 1, X-rays that have passed a subject is irradiated from the photodetector side 40 toward the scintillator panel 10. The scintillator panel 10 is disposed at the rear side as compared to the photodetector 40 in the X-ray travelling direction. When X-rays are incident on the scintillator panel 10 through a sensor board 400 of the photodetector 40, the phosphor 200 absorbs the X-rays and emits light, and the light is incident on a photoelectric conversion element formed on the sensor board 400. The electric charges accumulated in the photoelectric conversion element of the sensor board 400 are output as an electric signal.

A control module 50 that drives and controls the photodetector 40 is provided at the opposite side to the X-ray entrance side to the scintillator panel 10. The control module 50 includes, for example, a circuit board on which an IC as a control unit that drives and controls the sensor board 400, an IC that processes an image signal or the like is mounted, and a power supply circuit. The heat at the time of operating the control module 50 is radiated to the outside and also transferred to the scintillator panel 10 which is near the control module 50. The control module 50 is integrally assembled to the scintillator panel 10 and the photodetector 40.

2. Configuration of Photodetector

Figure 2:
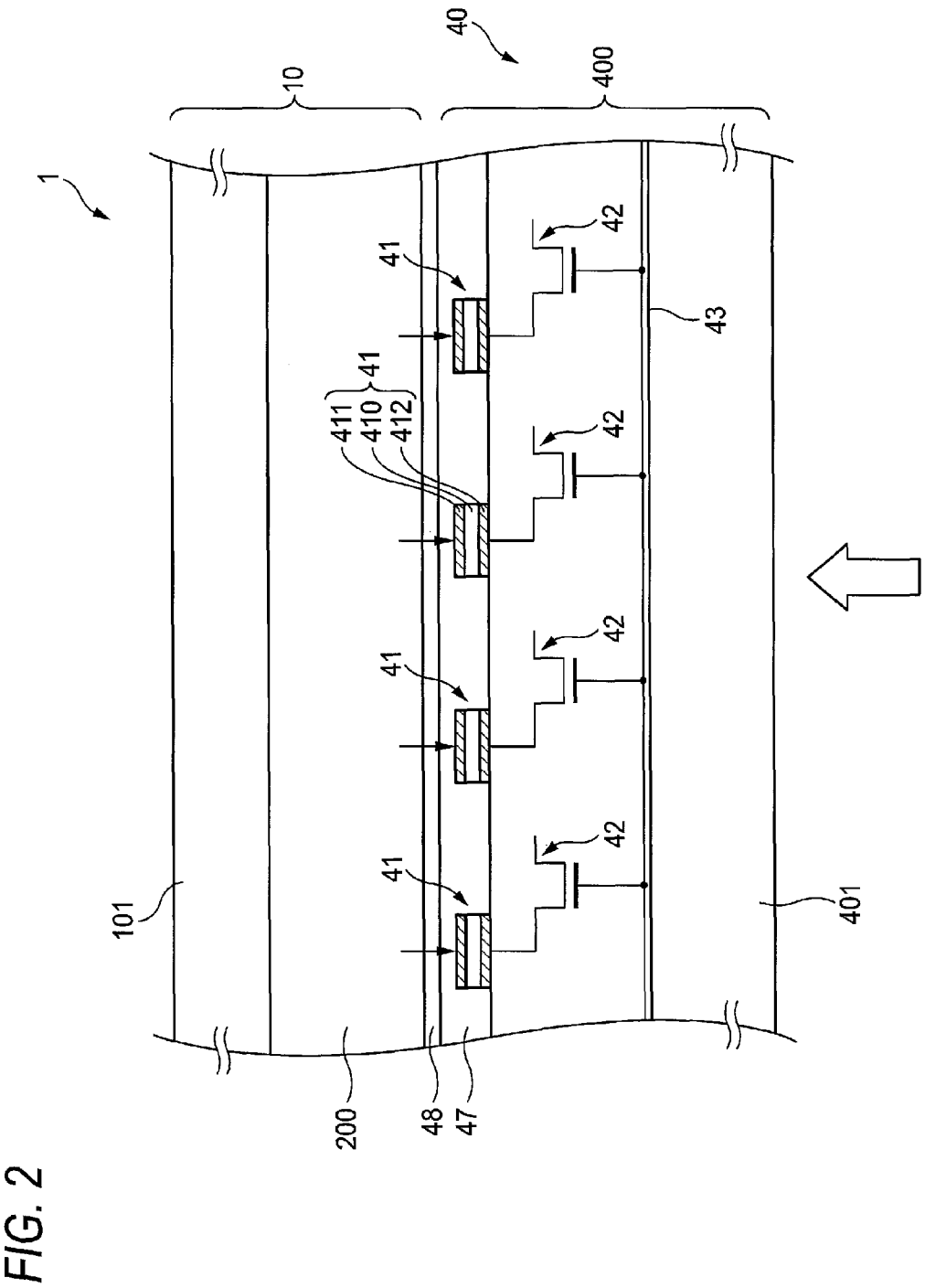
FIG. 2 is a side sectional view schematically illustrating an outline configuration of a photodetector.
Figure 3:
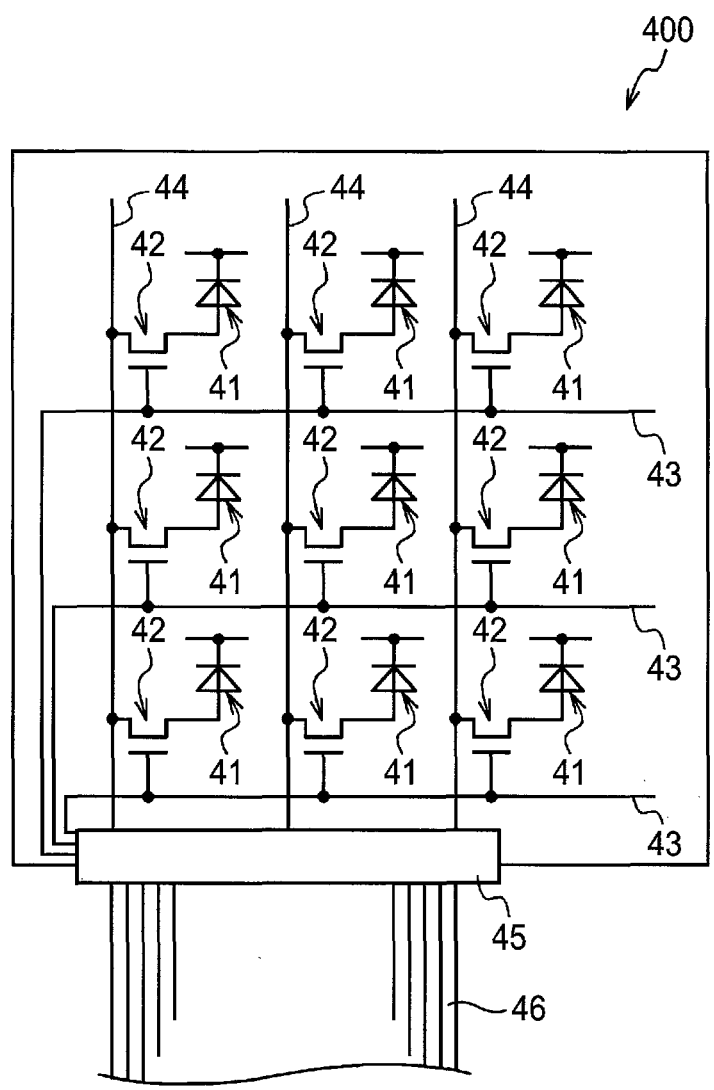
FIG. 3 is a plan view schematically illustrating a sensor board.

FIG. 2 is a side cross-sectional view schematically illustrating the configuration of the photodetector 40. FIG. 3 is a plan view schematically illustrating the sensor board 40. The photodetector 40 includes the sensor board 400 that is rectangular in plan view and is formed with a semiconductor layer. The sensor board 400 is configured to include an insulating substrate 401 such as glass, photoelectric conversion elements 41 such as a-Si photodiodes, and switching elements 42 such as thin film transistors (TFT).

As for the insulating substrate 401, for example, a glass substrate, various ceramic substrates, or a resin substrate may be used. Also, the insulating substrate 401 is not limited to these materials.

Each of the photoelectric conversion elements 41 is configured by laminating a photoconductive layer 410 that converts the light (the solid line arrow in FIG. 2) incident from the phosphor 200 included in the scintillator panel 10 into electric charges, a bias electrode 411 that applies a bias voltage to the photoconductive layer 410, and a charge collecting electrode 412 that collects the electric charges accumulated in the photoconductive layer 410. As illustrated in FIG. 3, the photoelectric conversion elements 41 are two-dimensionally arranged, and each of the photoelectric conversion elements 41 forms a pixel of an image detected by the photodetector 40.

As illustrated in FIG. 3, the switching elements 42, gate lines 43, and data lines 44 are provided in the photoelectric conversion elements 41, respectively. Each of the gate lines 43 and each of the data lines 44 are provided to extend to a connection terminal 45, and are connected to the circuit board of the control module 50 (FIG. 1) via a flexible wiring 46 connected to the connection terminal 45 such as an anisotropic conductive film. The switching elements 42 are switched ON/OFF line by line by a control signal transmitted via the gate line 43 from the control unit mounted in the circuit board, and electric charges of the photoelectric conversion element 41 of which the switching element 42 is placed in the "ON" state are read out as an image signal by the signal processing unit of the circuit board via the data line 44. As the electric charges of the photoelectric conversion elements 41 are sequentially read out line by line, a two-dimensional image is detected.

In addition, in the above described configuration, the gate lines 43 and data lines 44 are provided to extend to be orthogonal to each other. However, the gate lines 43 and the data lines 44 may be provided to extend to be parallel to each other and connected to a connecting terminal disposed a side of the peripheral ends of the sensor board 400.

The gate lines 43, the data lines 44, the switching elements 42, and the photoelectric conversion elements 41 as described above are formed on the scintillator panel 10 side surface of the insulating substrate 401. The gate lines 43, the data lines 44, the switching elements 42, and the photoelectric conversion elements 41 are sequentially formed on the insulating substrate 401 by, for example, a photo etching process. In FIG. 2, the surface of the sensor board 400 is flattened by a resin film 47 provided on the outermost layer of the sensor board 400. However, the resin film 47 may be omitted. The sensor board 400 and the scintillator panel 10 are bonded to each other through an adhesive layer 48.

Also, as described later, the adhesive layer 48 or the resin film 47 may not exist between the sensor board 400 and the scintillator panel 10 and the scintillator panel 10 and the surface of the sensor board 400 may be opposed to each other to be in close contact with each other.

3. Configuration of Scintillator Panel

[3-1. Overall Configuration]

As illustrated in FIG. 1, the scintillator panel 10 includes a support (substrate) 101, a phosphor 200 formed on the support 101 by a vapor deposition method, and a protective film (moisture proof film) 30 of, for example, parylene, which covers and seals the phosphor 200 on the support 101. The protective film of parylene formed by the vapor deposition method is excellent in adhesion with the phosphor 200 and also has flexibility, thereby showing a good conformability with the warping or the like in the support 101.

The support 101 is formed as a plate using a material that has a high X-ray transmissivity and reflects light such as Al.

The support 101 is not limited to the plate made of Al and may be properly selected from, for example, a carbon plate, a carbon fiber reinforced plastic (CFRP), a glass plate, a quartz substrate, a sapphire substrate and the like, but not particularly limited thereto as long as the phosphor 200 may be formed on the support surface. However, when the support 101 also serves as a reflective member of light, a light metal such as Al as a material for the support may be preferably used.

The phosphor 200 of the present exemplary embodiment is formed using CsI:Tl (thallium-activated cesium iodide) as a material, but may be formed using other materials, for example, NaI:Tl (thallium-activated sodium iodide), CsI:Na (sodium-activated cesium iodide). Also, CsI:Tl may be preferably used as a material to form the phosphor 200 in view of the fact that the light emission spectrum is suitable for the maximum value (around 550 nm) of the spectral sensitivity of a-Si photodiode.

Figure 4:
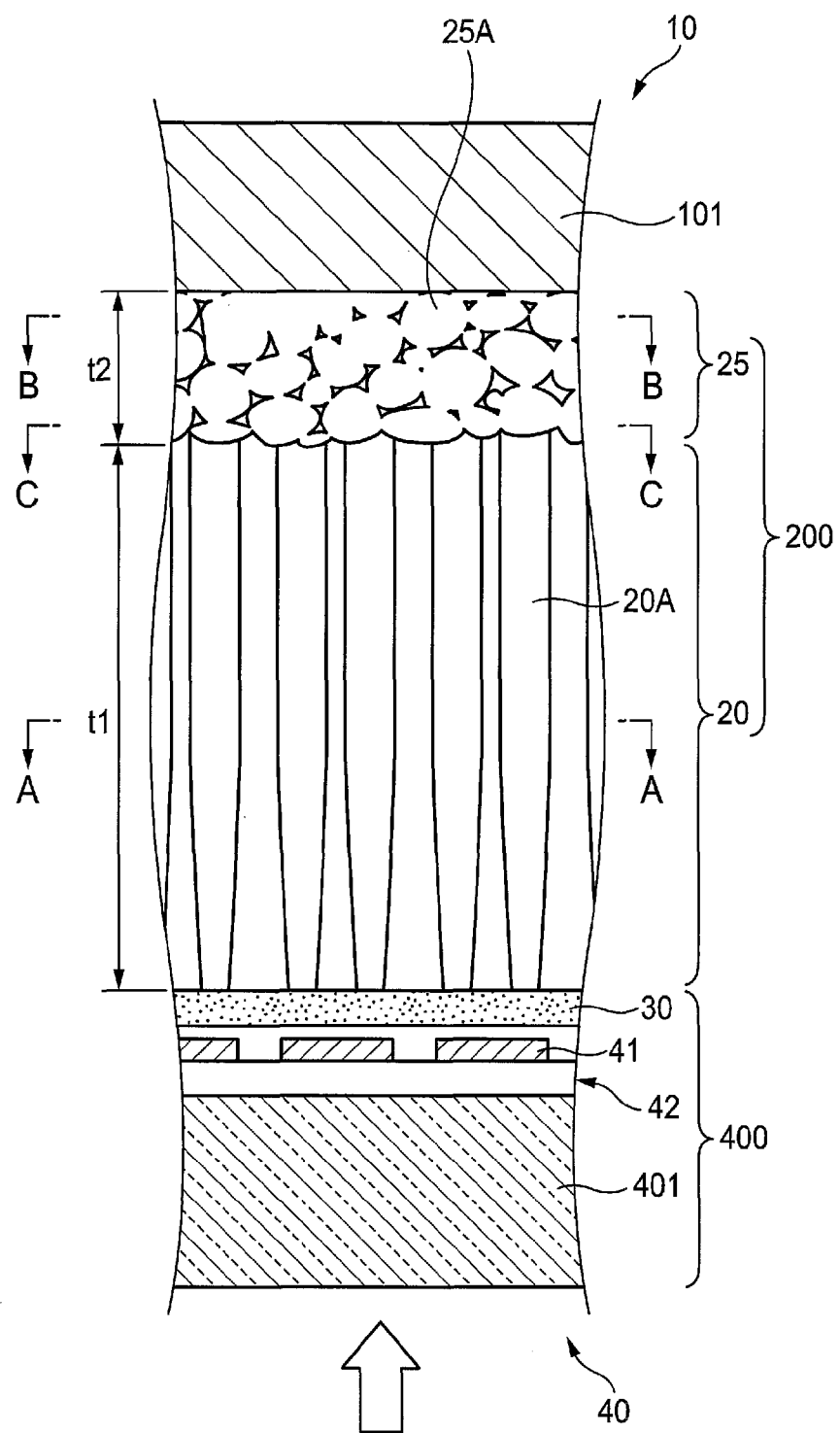
FIG. 4 is a side sectional view schematically illustrating a columnar section and a non-columnar section included in a phosphor.

FIG. 4 is a side cross-sectional view schematically illustrating the configuration of the phosphor 200. The phosphor 200 includes a columnar section 20, a non-columnar section 25 provided between the columnar section 20 and the support 101. In the phosphor 200, the columnar section 20 is disposed at the X-ray entrance side indicated by the outline arrow, and the non-columnar section 25 is disposed at the opposite side to the X-ray entrance side.

The fluorescence emitted from the phosphor 200 by irradiation of X-rays is guided in the columnar height direction by the columnar crystals 20A and incident on the photodetector 40. In this case, a part of the light traveling toward the support 101 side is reflected by the support 101 and incident on the photodetector 40.

[3-2. Configuration of Columnar Section]

The columnar section 20 is an aggregate of plural columnar crystals 20A. In the example illustrated in FIG. 4, each of the columnar crystals 20A is erect substantially perpendicular to the support 101. Each of the columnar crystals 20A of this example has a tapered shape at the front end portion side. The front end portion of each of the columnar crystals 20A may be flattened through a polishing. The front end portions of plural columnar crystals 20A face one pixel (photoelectric conversion element 41) of the photodetector 40.

Figure 5:
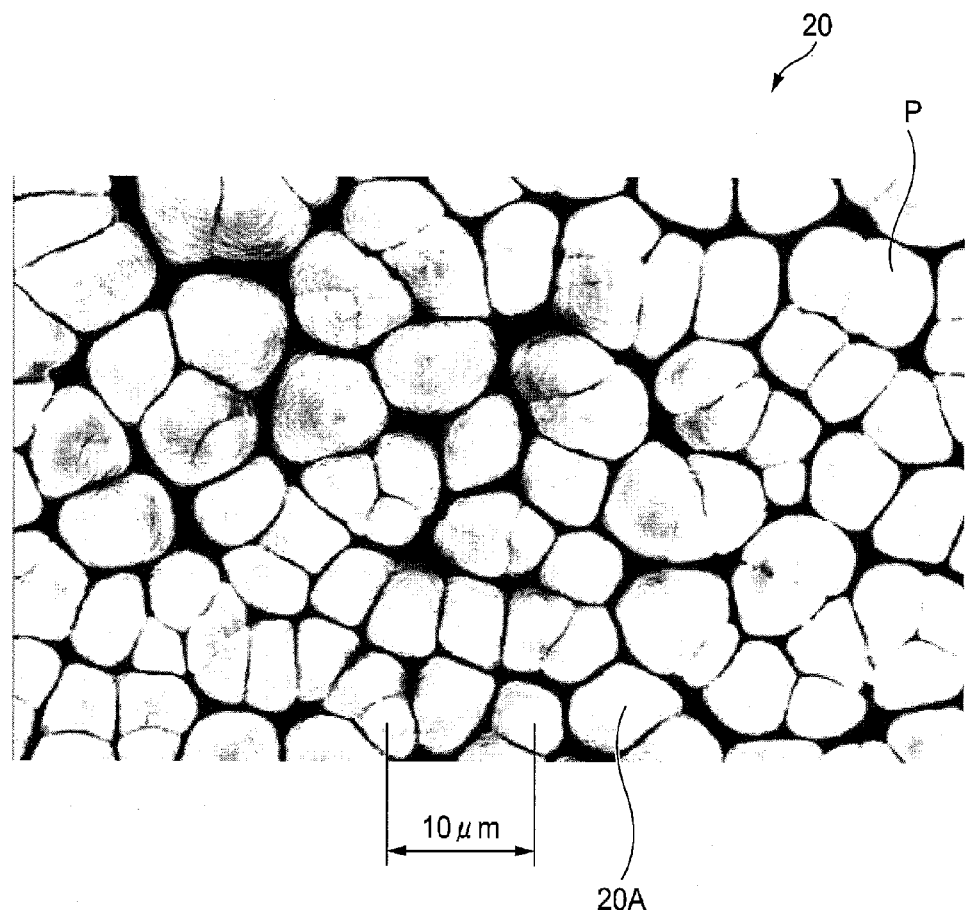
FIG. 5 is an electron micrograph (SEM image) illustrating a columnar crystal cross section of a columnar section.

FIG. 5 is an electron micrograph of the columnar section 20 in A-A cross-section of FIG. 4 (the cross section around the center in the height direction of the columnar section 20). Between adjacent columnar crystals 20A, gaps exists (the parts that looks darker in FIG. 5). The columnar crystals 20A have substantially uniform cross-sectional diameters in the crystal growth direction. In a part of the region of the columnar section 20, adjacent columnar crystals 20A may be bonded to each other to integrally form a columnar body (e.g., P in FIG. 5).

The crystal diameter of the columnar crystals 20A is 2 μm or more and 8 μm or less, but more preferably 6 μm or more and 8 μm or less in the viewpoint of providing an efficient light guide property. If the diameter of the columnar section 20 is too small, the shock resistance is reduced. Thus, it is preferable that the crystal diameter of the columnar section 20 is 2 μm or more. In addition, if the crystal diameter is excessively large, the number of the columnar crystals 20A per each pixel of the photodetector 40 is reduced. Thus, it becomes highly probable that a defect occurs in the signal of the pixel when a crack occurs in a columnar crystal 20. For this reason, it is preferable that the crystal diameter of the columnar section 20 is 8 μm or less.

In addition, the crystal diameter of the columnar crystal 20A refers to a maximum diameter of a crystal observed from the top side in the growing direction of the columnar crystal 20A. In a specific measuring method, the columnar diameter (cross-sectional diameter) is measured by observation from a plane perpendicular to the height direction of the columnar crystals 20A with an SEM (scanning electron micrograph). Observation is performed with a magnification (about 2,000×) that allows 100 to 200 columnar crystals 20A to be observed when the scintillator panel 10 is viewed from the surface (the surface opposite to the support) at one shot. A value obtained by measuring and taking an average on the maximum values of the columnar diameters obtained by scanning in the height direction for all the crystals included at the one shot is employed. The columnar diameters (μm) are read to two decimal places, and the average value is determined by rounding off to one decimal place in accordance with JISZ8401.

In addition, the thickness of the columnar section 20 may be determined to be 500 μm or more in consideration of the X-ray absorption power corresponding to a desired sensitivity. However, when the thickness of the columnar section 20 is too thick, the luminance efficiency may be easily degraded due to, for example, the attenuation and scattering of light. For this reason, the thickness of the columnar section may be determined as a proper value considering each of the sensitivity and luminance efficiency.

[3-3. Configuration of Non-Columnar Section]

As illustrated in FIG. 4, the first non-columnar section 25 is configured to include (a group of) the non-columnar crystals 25 of a substantially spherical or indeterminate granular shape. Also, the first non-columnar section 23 may include an amorphous part.

It is preferable that the shape of the non-columnar crystals 25A is substantially spherical from the viewpoint that pores may be easily maintained between crystals and the reflection may be enhanced. That is, it is preferable that the non-columnar section 25 configured by an aggregate of crystals which are nearly spherical (non-columnar crystals 25A which are substantially spherical crystals).

Figure 6:
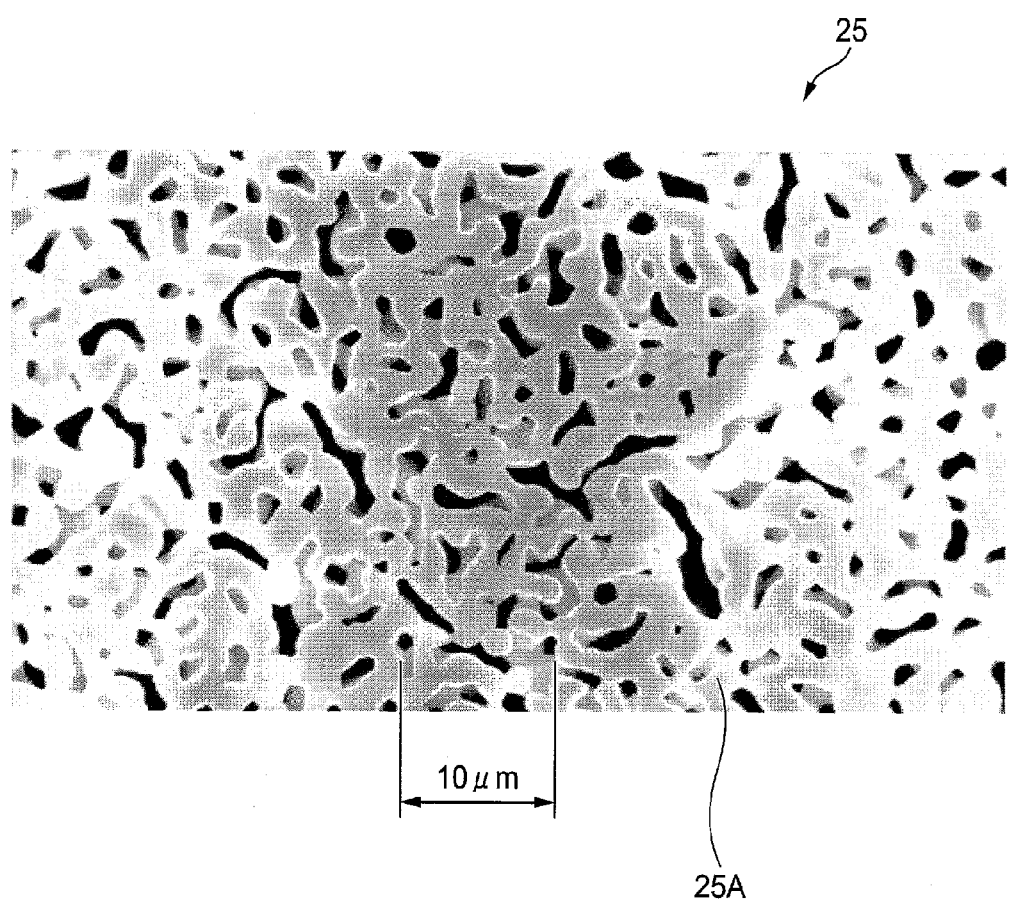
FIG. 6 is an electron micrograph (SEM image) illustrating a cross-section of a non-columnar section.

FIG. 6 is an electron micrograph of the non-columnar section 25 at the B-B cross-section of FIG. 4 (the cross-section of the base end side in the thickness direction of the non-columnar section 25). In the non-columnar section 25, the crystals which have a small diameter as compared to the columnar crystals 20A of FIG. 5 are irregularly bonded to each other or overlapped with each other and clear pores between crystals are hardly confirmed. For this reason, the non-columnar crystals 25A are frequently fused to each other in the thickness direction of the non-columnar section 25 or also in the in-plane direction perpendicular to the thickness direction. Also, when amorphous parts are included in the non-columnar section 25, the non-columnar crystals 25A and the amorphous parts may also be fused to each other in the thickness direction or in the in-plane direction.

FIGS. 5 and 6 illustrate pores observed in the cross-sections of the columnar section 20 and the non-columnar section 25, respectively. Here, a porosity is defined as a volumetric ratio of a space in relation to the region occupied by the phosphor 200 in the three-dimensional space in the thickness direction of the columnar section 20 or the non-columnar section 25, and thus, does not coincide with the area ratio of the pores to the phosphor 200 observed in each of the photographs of FIGS. 5 and 6. However, the porosities may be estimated from the photographs and may also be compared to each other. From the results of observation of FIGS. 5 and 6, the porosity of the non-columnar section 25 is lower than that of the columnar section 20.

Although pores may be seen at the base end side of the thickness direction of the non-columnar section 25 as in FIG. 6, the porosity of a portion (initial vapor deposition layer) adjoining the surface of the support 101 in the non-columnar section 25 is 0 or substantially 0 and the base end of the non-columnar section 25 is in close contact with the support 101 over the entire contact surface. Meanwhile, the porosity related to the C-C cross-section of FIG. 4 at the front end portion of the deposition direction of the non-columnar section 25 is higher than the porosity related to the B-B cross-section of FIG. 6. A portion with a high porosity in the non-columnar section 25 includes nucleuses where the growth of the columnar crystals 20A is started.

That is, the porosity of the non-columnar section 25 has a gradient in the thickness direction of the non-columnar section 25. The porosity of the non-columnar section 25 may fluctuate up and down several times in the thickness direction of the non-columnar section 25 but has a gradient in which the porosity gradually increases at least in the thickness direction from the portion adjoining the surface of the support 101 to the front end portion of the non-columnar section 25.

In addition, the porosity of the front end portion of the non-columnar section 25 is also lower than the porosity of the columnar section 20. That is, the porosity of each of the portions of the non-columnar section 25 divided in the thickness direction is lower than the porosity of the columnar section 20. The porosity of each of the portions in the thickness direction of the non-columnar section 25 may be properly determined according to the manufacturing conditions such as the temperature of the support, the vapor deposition rate, and the degree of vacuum at the time of fabricating the phosphorous 200.

The porosity of the non-columnar section 25 is calculated based on, for example, the deposition area of the non-columnar section 25 to the support 102, the thickness of the non-columnar section 25, the CsI density and the practically measured weight of the scintillator panel 10. The porosity of the entire non-columnar section 25 in the thickness direction calculated in this manner is 10% or less.

The thickness of the non-columnar section 25 is preferably 5 μm or more and 125 μm or less. In order to secure the adhesion with the support 101, it is preferable that the thickness of the non-columnar section 25 is 5 μm or more. In addition, when the thickness of the non-columnar section 25 which does not have a light guide effect is too thick, light may be interlaced between pixels in the non-columnar section 25 so that image blur may easily occur. Thus, it is preferable that the thickness of the non-columnar section 25 is 125 μm or less.

Also, the thickness of the non-columnar section 25 is sufficient with the minimum thickness where the adhesion with the support 101 and the reflection function of light may be obtained. That is, when the thickness of the non-columnar section 25 is set to 10 μm or more and 50 μm or less, the used amount of an expensive phosphor material may be reduced, thereby resulting in cost reduction.

According to, for example, a condition at the time of manufacturing, the non-columnar section 25 may be formed in a configuration in which plural layers are laminated rather than in a configuration with a single layer. In such a case, the thickness of the non-columnar section 25 refers to the thickness from the surface of the support 101 to the surface of the outermost layer of the non-columnar section 25.

The measurement of the crystal diameter when crystals are coalescent to each other as in the non-columnar section 25 was performed as follows. A line interconnecting adjacent concave portions (recesses) formed between adjacent non-columnar crystals 25A was considered as a grain boundary between the crystals, the coalescent crystals were separated into the smallest polygons, and the crystal diameters were measured. Then, a value was obtained by taking an average on the measured diameters like the diameter of the columnar crystals 20A in the columnar section 20, and the value was employed.

From the viewpoint of providing a efficient reflective property and the adhesion with the support 101, it is preferable that the diameter of the non-columnar crystals 25A of the non-columnar section 25 is 0.5 μm or more and 7.0 μm or less. The diameter of the non-columnar crystals 25A is smaller than the diameter of the columnar crystals 20A.

Here, the smaller diameter of the non-columnar crystals 25A is preferable since the substantially spherical shape may be easily maintained. However, if the diameter of the non-columnar crystals 25A is too small, the porosity becomes nearly 0 and the non-columnar section 25 does not serves as a reflective layer of light. For this reason, it is preferable that the diameter of the non-columnar crystals 25A is not less than 0.5 μm. In addition, if the diameter is too large, the flatness and surface area of the non-columnar section 25 are degraded. Thus, the adhesion with the support 101 is degraded and the crystals are bonded to each other to reduce the porosity, thereby degrading the reflective effect. For this reason, it is preferable that the crystal diameter of the non-columnar section 25 is not more than 7.0 μm.

As described above, the scintillator panel 10 including the columnar section 20 and the non-columnar section 25 may be formed on the support 101 using a vapor deposition method as described below. In addition, even if the columnar section 20 and the non-columnar section 25 are formed successively in time, the columnar section 20 may be formed at an interval after the non-columnar section 25 is formed on the support 101.

After the non-columnar section 25 is formed on the support 101 at predetermined conditions including the degree of vacuum and the temperature of the support, and then the growth of the columnar crystals 20A is started by changing the conditions. The columnar section 20 is erect on the surface layer portion of the non-columnar section 25. By growing the columnar section 20 based on the non-columnar section 25 in this manner, the crystallinity of the columnar section 20 may be improved.

Here, the thicknesses of the columnar section 20 and the non-columnar section 25 are compared to each other. As illustrated in FIG. 4, when the thickness of the columnar section 20 is set to t1 and the thickness of the non-columnar section 25 is set to t2, it is preferable that the relation between t1 and t2 satisfies the equation below.

$$0.01 \leq (t2/t1) \leq 0.25 \qquad \text{(Equation)}$$

When the thickness t1 of the columnar section 20, and the thickness t2 of the second non-columnar section 25 satisfy the equation above, in the phosphor 200, the light emission efficiency in each portion in the thickness direction, and a region of preventing light diffusion and a region of reflecting light may be placed in appropriate ranges, respectively. Also, the emission efficiency of light, the detection efficiency of light, and the definition of an image are improved. When the thickness t2 of the non-columnar section 25 is too thick, there is concern that a region with a low light emission efficiency is increased, thereby degrading the sensitivity. From this viewpoint, it is more preferable that (t2/t1) is within a range of 0.02 or more and 0.1 or less.

As for the photodetector 40 and the scintillator panel 10 as described above, for example, an organic photoelectric conversion material (OPC), an organic TFT, a TFT using an amorphous oxide (e.g., a-IGZO), or a flexible material (aramid, bio nanofiber) may be used. These device-related materials will be described later.

4. Acting Effects on Columnar Section and Non-Columnar Section

Hereinafter, main acting effects of the columnar section 20 and the non-columnar section 25 will be described.

The columnar section 20 is excellent in crystallinity and high in light emission efficiency of fluorescence as compared to the non-columnar section 25. Also, since the columnar crystals 20A which have a columnar crystal shape are adjacent to each other via a gap, are provided to stand in the thickness direction of the support 101, the columnar crystals 20A serve as a guide for light and guide the light in the columnar height direction. Since the columnar section 20 is disposed at the X-ray entrance side and at the position close to the photodetector 40 in the phosphor 200, X-rays that are hardly attenuated immediately after passing through the sensor board 400 are incident on the columnar section 20 to be converted into light. Then, the fluorescence is rapidly incident on the photodetector 40, thereby increasing the amount of light incident on the photodetector 40. That is, the available luminescence amount of the scintillator panel 10 may be increased. Since this and the light guide effect by the columnar crystals 20A may suppress the light diffusion between pixels, a detected image may be sharpened.

Meanwhile, the non-columnar section 25 which has granular crystals having a smaller diameter than the columnar crystals 20A, and a predetermined gap having a lower porosity than the columnar section 20 reflects the light that is mainly emitted from the columnar section 20 and travels toward the support 101, toward the photodetector 40. The reflection of the light by the non-columnar section 25 contributes to the improvement in efficiency of using the light emitted from the scintillator 200 together with the reflection of the light by the support 101. Accordingly, since the quantity of light incident on the photodetector 40 and used for image detection is increased, the detected image may be further sharpened. Also, since the non-columnar section 25 has a reflecting characteristic of light, the support may be formed of a material having a low light reflectivity such as glass, carbon or the like.

Furthermore, as described above, since the non-columnar section 25 having a porosity lower than the columnar section 20 is interposed between the columnar section 20 and the support 101, the flatness and surface area of the portion opposed to the support 101 in the phosphor 200 are increased as compared to the configuration where the columnar section 20 is directly formed on the surface of the support 101 and thus, the adhesion of the phosphor 200 in relation to the support 101 is improved.

Here, since the porosity of the portion of the non-columnar section in contact with the support 101 is 0 or substantially 0, and the adhesion of the other portion with the support 101 is secured by a configuration having proper pores the peel strength of the non-columnar section 25 and the bonding strength of the non-columnar section 25 and the columnar section 20 may be enhanced and thus, the strength of the entire scintillator panel 10 may be enhanced as compared to a case in which the entire thickness of the non-columnar section is formed in a beta type.

In addition, in order for the non-columnar section 25 to exhibit a reflective property of light, it is required that the porosity of the non-columnar section 25 be lower than the porosity of the columnar section 20. However, when the porosity of the entire non-columnar section 25 is too low to such an extent that the mean porosity in the thickness direction of the non-columnar section 25 becomes 0, light is not reflected within the non-columnar section 25 and thus, the non-columnar section 25 does not perform the role as a reflective layer. When the porosity of the non-columnar section 25 is too low, the substantially spherical crystals included in the non-columnar section 25 are bonded to each other, thereby forming an indeterminate shape or having a large diameter. Thus, a pore reduction phenomenon often occurs. If the shape of the crystals is substantially spherical, pores between the crystals may be easily maintained even if the crystals are overlapped with each other. Thus, it is easy to maintain the porosity that exhibits the reflective property. The substantially spherical shape may be maintained even if the diameter is small. However, when the diameter is too small, the porosity becomes near 0 and the reflective property is lost. That is, it is preferable that each of the crystal diameter and the porosity of the non-columnar section 25 may be determined from the viewpoint of retaining the substantially spherical crystals and maintaining the predetermined porosity capable of exhibiting the reflective property. Considering the reflective property of the non-columnar section 25, it is preferable that the porosity exceeds 0 and is 10% or less. More preferable porosity of the non-columnar section 25 is 3% or more. It is preferable that the diameter of the non-columnar crystals 25A is determined to a suitable range (as described above, 0.5 µm or more and 7.0 µm or less) in relation to the porosity. In addition, when the porosity of the non-columnar section 25 is determined, the thickness of the non-columnar section 25 may also be considered.

Due to the improvement of the adhesion in relation to the support 101, it is possible to prevent the phosphor 200 from being peeled offt from the support 101 thermally deformed when the temperature is changed. In the X-ray image detection apparatus 1 of the present exemplary embodiment in which X-rays are irradiated from the photodetector 40 side to the scintillator panel 10, the control module 50 is provided at a position adjacent to the support 10 and thus, the thermal influence on the scintillator panel 10 by the heat emitted from the control module 50 is very high. Thus, it is very meaningful that the peel-off from the support 101 may be prevented due to the improvement of the adhesion with the support 101.

In addition, since the sealability of the phosphor 200 by the protective film 30 on the support is maintained by securing the adhesion with the support 101 it is possible to suppress the performance of the phosphor 200 from being degraded by deliquescence of the phosphor 200.

Furthermore, by securing the adhesion with the support 101, it is possible to prevent the phosphor 200 from being damaged at the time of shock of falling-down or the like or to prevent the degradation of the reflectivity of the support 101 by the peel-off. In particular, when the X-ray image detection apparatus 1 is attached to a device case, the phosphor 200 may be hardly damaged even if the X-ray image detection apparatus 1 receives load from the device case.

From the foregoing, since in the phosphor 200, the columnar section 20 with a high luminescence efficiency and a light guide effect is disposed at the X-ray entrance side and the non-columnar section 25 with a reflective function of light and a low porosity for securing the adhesion with the support is disposed at the side opposite to the X-ray entrance side, it becomes possible to highly acquire either of the adhesion with the support 101 or the luminescence amount incident on the photodetector 40 from the scintillator panel 10.

With such an X-ray image detection apparatus 1, an X-ray image may be detected with high sensitivity and high definition, and the adhesion of the support 101 and the phosphor 200 may be improved, thereby improving reliability.

The X-ray image detection apparatus 1 as described above may be used in a state where it is mounted within various devices such as an X-ray imaging device for medical use. Especially, in a mammography device that requires the detection of a sharp image at a low radiation irradiation dose, the X-ray image detection apparatus 1 according to the present exemplary embodiment which has characteristics of a high sensitivity, and a high definition may be appropriately used. Further, when the X-ray image detection apparatus 1 is configured as a portable cassette detachable to an X-ray imaging device, it is highly probable that the X-ray image detection apparatus 1 may be subject to drop shock, and it is important to secure the shock resistance of the phosphor 200 by bringing the sensor board 400 into close contact with the support 101. Thus, the above described effect of improving the adhesion with the support 101 is advantageous.

Also, the X-ray image detection apparatus 1 has a wide application range thereof since it may be used not only in the X-ray imaging device for medical use, but also in, for example, an X-ray imaging device for industrial use for a non-destructive test, or as a device for detecting corpuscular beams (α rays, β-rays, γ rays) besides electromagnetic waves.

5. Applicable Device Material

[5-1. Organic Photoelectric Conversion (OPC) Material]

For example, any OPC (Organic Photoelectric Conversion) material disclosed in JP-A-2009-32854 can be used for the aforementioned photoelectric conversion elements 41 (FIG. 2). A film formed out of the OPC material (hereinafter referred to as OPC film) can be used as the photoconductive layers 410 of the photoelectric conversion elements 41. The OPC film contains an organic photoelectric conversion material, which absorbs light emitted from the scintillator and generates electric charges corresponding to the absorbed light. Thus, the OPC film containing the organic photoelectric conversion material has a sharp absorption spectrum in a visible light range. Electromagnetic waves other than the light emitted by the scintillator are hardly absorbed by the OPC film. Thus, noise generated by radioactive rays such as X-rays absorbed by the OPC film can be suppressed effectively.

It is preferable that the absorption peak wavelength of the organic photoelectric conversion material forming the OPC film is closer to the peak wavelength of light emitted by the scintillator in order to more efficiently absorb the light emitted by the scintillator. Ideally, the absorption peak wavelength of the organic photoelectric conversion material agrees with the peak wavelength of the light emitted by the scintillator. However, if the difference between the absorption peak wavelength of the organic photoelectric conversion material and the peak wavelength of the light emitted by the scintillator is small, the light emitted by the scintillator can be absorbed satisfactorily. Specifically, the difference between the absorption peak wavelength of the organic photoelectric conversion material and the peak wavelength of the light emitted by the scintillator in response to radioactive rays is preferably not larger than 10 nm, more preferably not larger than 5 nm.

Examples of the organic photoelectric conversion material that can satisfy such conditions include arylidene-based organic compounds, quinacridone-based organic compounds, and phthalocyanine-based organic compounds. For example, the absorption peak wavelength of quinacridone in a visible light range is 560 nm. Therefore, when quinacridone is used as the organic photoelectric conversion material and CsI(Tl) is used as the scintillator material, the aforementioned difference in peak wavelength can be set within 5 nm so that the amount of electric charges generated in the OPC film can be increased substantially to the maximum.

At least a part of an organic layer provided between the bias electrode 411 and the charge collection electrode 412 can be formed out of an OPC film. More specifically, the organic layer can be formed out of a stack or a mixture of a portion for absorbing electromagnetic waves, a photoelectric conversion portion, an electron transport portion, an electron hole transport portion, an electron blocking portion, an electron hole blocking portion, a crystallization prevention portion, electrodes, interlayer contact improvement portions, etc.

Preferably the organic layer contains an organic p-type compound or an organic n-type compound. An organic p-type semiconductor (compound) is a donor-type organic semiconductor (compound) as chiefly represented by an electron hole transport organic compound, meaning an organic compound having characteristic to easily donate electrons. More in detail, of two organic materials used in contact with each other, one with lower ionization potential is called the donor-type organic compound. Therefore, any organic compound may be used as the donor-type organic compound as long as the organic compound having characteristic to donate electrons. Examples of the donor-type organic compound that can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, fluoranthene derivative), a metal complex having a nitrogen-containing heterocyclic compound as a ligand, etc. The donor-type organic semiconductor is not limited thereto but any organic compound having lower ionization potential than the organic compound used as an n-type (acceptor-type) compound may be used as the donor-type organic semiconductor.

The n-type organic semiconductor (compound) is an acceptor-type organic semiconductor (compound) as chiefly represented by an electron transport organic compound, meaning an organic compound having characteristic to easily accept electrons. More specifically, when two organic compounds are used in contact with each other, one of the two organic compounds with higher electron affinity is the acceptor-type organic compound. Therefore, any organic compound may be used as the acceptor-type organic compound as long as the organic compound having characteristic to accept electrons. Examples thereof include a fused aromatic carbocyclic compound (naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g. pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine etc.), a polyarylene compound, a fluorene compound, a cyclopentadiene compound, a silyl compound, and a metal complex having a nitrogen-containing heterocyclic compound as a ligand. The acceptor-type organic semiconductor is not limited thereto. Any organic compound may be used as the acceptor-type organic semiconductor as long as the organic compound has higher electron affinity than the organic compound used as the donor-type organic compound.

As for p-type organic dye or n-type organic dye, any known dye may be used. Preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, Spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic dyes (naphthalene derivative, anthracene derivative, phenanthrene derivative, tetracene derivative, pyrene derivative, perylene derivative, fluoranthene derivative).

A photoelectric conversion film (photosensitive layer) which has a layer of a p-type semiconductor and a layer of an n-type semiconductor between a pair of electrodes and at least one of the p-type semiconductor and the n-type semiconductor is an organic semiconductor and in which a bulk heterojunction structure layer including the p-type semiconductor and the n-type semiconductor is provided as an intermediate layer between those semiconductor layers may be used preferably. The bulk heterojunction structure layer included in the photoelectric conversion film can cover the defect that the carrier diffusion length of the organic layer is short. Thus, the photoelectric conversion efficiency can be improved. The bulk heterojunction structure has been described in detail in JP-A-2005-303266.

It is preferable that the photoelectric conversion film is thicker in view of absorption of light from the phosphor layer. The photoelectric conversion film is preferably not thinner than 30 nm and not thicker than 300 nm, more preferably not thinner than 50 nm and not thicker than 250 nm, particularly more preferably not thinner than 80 nm and not thicker than 200 nm in consideration of the ratio which does make any contribution to separation of electric charges.

As for any other configuration about the aforementioned OPC film, for example, refer to description in JP-A-2009-32854.

[5-2. Organic Thin Film Transistor (TFT)]

Although inorganic materials are often used for the aforementioned TFT switching elements 42, organic materials may be used, for example, as disclosed in JP-A-2009-212389. Organic TFT may have any type of structure but a field effect transistor (FET) structure is the most preferable. In the FET structure, a substrate is disposed in the bottom layer, and a gate electrode is provided partially an upper surface of the substrate. An insulator layer is provided to cover the electrode and touch the substrate in the other portion than the electrode. Further, a semiconductor active layer is provided on an upper surface of the insulator layer, and a source electrode and a drain electrode are disposed partially on the upper surface of the semiconductor active layer and at a distance from each other. This configuration is called a top contact type device. A bottom contact type device in which a source electrode and a drain electrode are disposed under a semiconductor active layer may be also used preferably. In addition, a vertical transistor structure in which a carrier flows in the thickness direction of an organic semiconductor film may be used.

(Semiconductor Active Layer)

A p-type organic semiconductor material is used as the material of the semiconductor active layer. The p-type organic semiconductor material is substantially colorless and transparent. For example, the thickness of the organic semiconductor thin film may be measured by a stylus thickness meter. A plurality of thin films with different thicknesses may be manufactured and their absorption spectra may be measured so that the maximum absorbance per film thickness of 30 nm can be obtained by conversion based on a calibration curve.

Organic semiconductor materials mentioned herein are organic materials showing properties as semiconductors. Examples of the organic semiconductor materials include p-type organic semiconductor materials (or referred to as p-type materials simply or as electron hole transport materials) which conduct electron holes (holes) as carriers, and n-type organic semiconductor materials (or referred to as n-type materials simply or as electrode transport materials) which conduct electrons as carriers, similarly to a semiconductor formed out of an inorganic material. Of the organic semiconductor materials, lots of p-type materials generally show good properties. In addition, p-type transistors are generally excellent in operating stability as transistors under the atmosphere. Here, description here will be made on a p-type organic semiconductor material.

One of properties of organic thin film transistors is a carrier mobility (also referred to as mobility simply) μ which indicates the mobility of a carrier in an organic semiconductor layer. Although preferred mobility varies in accordance with applications, higher mobility is generally preferred. The mobility is preferably not lower than $1.0 \times 10^{-7}$ cm$^2$/Vs, more preferably not lower than $1.0 \times 10^{-6}$ cm$^2$/Vs, further preferably not lower than $1.0 \times 10^{-5}$ cm$^2$/Vs. The mobility can be obtained by properties or TOF (Time Of Flight) measurement when the field effect transistor (FET) device is manufactured.

The p-type organic semiconductor material may be either a low molecular weight material or a high molecular weight material, but preferably a low molecular weight material. Lots of low molecular weight materials typically show excellent properties due to easiness in high purification because various refining processes such as sublimation refining, recrystallization, column chromatography, etc. can be applied thereto, or due to easiness in formation of a highly ordered crystal structure because the low molecular weight materials have a fixed molecular structure. The molecular weight of the low molecular weight material is preferably not lower than 100 and not higher than 5,000, more preferably not lower than 150 and not higher than 3,000, further more preferably not lower than 200 and not higher than 2,000.

Preferred specific examples of such a p-type organic semiconductor material will be shown. Bu represents a butyl group, Pr represents a propyl group, Et represents an ethyl group, and Ph represents a phenyl group.

[Chem. 1]

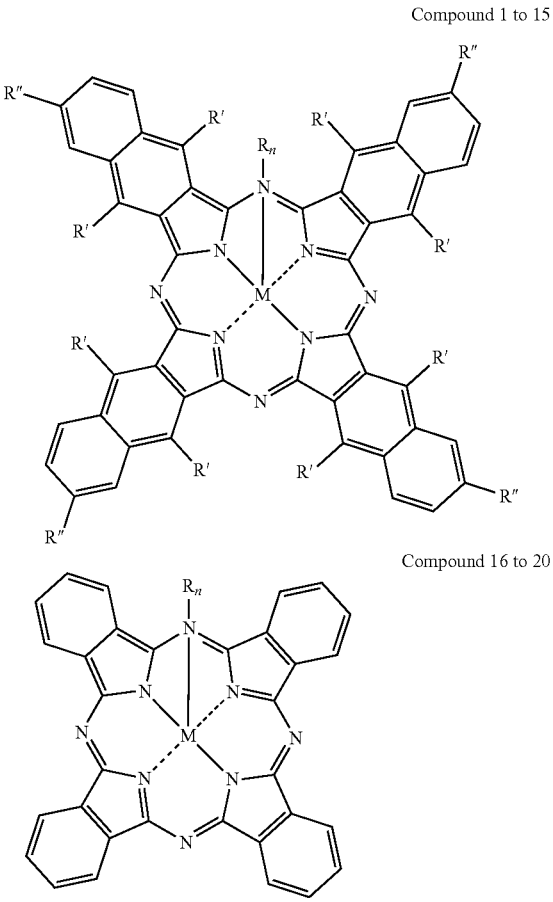

Compound 1 to 15

Compound 16 to 20

| Compound | M | R | n | R' | R" |
|---|---|---|---|---|---|
| 1 | Si | OSi(n-Bu)$_3$ | 2 | H | H |
| 2 | Si | OSi(i-Pr)$_3$ | 2 | H | H |
| 3 | Si | OSi(OEt)$_3$ | 2 | H | H |
| 4 | Si | OSiPh$_3$ | 2 | H | H |
| 5 | Si | O(n-C$_8$H$_{17}$) | 2 | H | H |
| 7 | Ge | OSi(n-Bu)$_3$ | 2 | H | H |
| 8 | Sn | OSi(n-Bu)$_3$ | 2 | H | H |
| 9 | Al | OSi(n-C$_6$H$_{13}$)$_3$ | 1 | H | H |
| 10 | Ga | OSi(n-C$_6$H$_{13}$)$_3$ | 1 | H | H |
| 11 | Cu | — | — | O(n-Bu) | H |
| 12 | Ni | — | — | O(n-Bu) | H |
| 13 | Zn | — | — | H | t-Bu |
| 14 | V=O | — | — | H | t-Bu |
| 15 | H$_2$ | — | — | H | t-Bu |
| 16 | Si | OSiEt$_3$ | 2 | — | — |
| 17 | Ge | OSiEt$_3$ | 2 | — | — |
| 18 | Sn | OSiEt$_3$ | 2 | — | — |
| 19 | Al | OSiEt$_3$ | 1 | — | — |
| 20 | Ga | OSiEt$_3$ | 1 | — | — |

(Device Constituent Materials Other than Semiconductor Active Layer)

Description will be made below on device constituent materials other than the semiconductor active layer in the organic thin film transistor. The visible-light or infrared-light transmittance of each of those materials is preferably not lower than 60%, more preferably not lower than 70%, further more preferably not lower than 80%.

The substrate is not limited particularly as long as it has required smoothness. Examples of the substrate include glass, quartz, light transmissive plastic film, etc. Examples of the light transmissive plastic film include films or the like, made from polyethylene terephthalate (PET), polyethylene naphthalate (PEN), polyether sulfone (PES), polyether imide, polyetheretherketone, polyphenylene sulfide, polyalylate, polyimide, polycarbonate (PC), cellulose triacetate (TAC), cellulose acetate propionate (CAP), etc. In addition, any organic or inorganic filler may be contained in these plastic films. A flexible substrate formed out of aramid, bionanofiber, or the like may be used preferably as the substrate.

The material forming the gate electrode, the source electrode or the drain electrode is not limited especially if it has required electric conductivity. Examples thereof include electrically conductive oxides such as ITO (indium-doped tin oxide), IZO (indium-doped zinc oxide), SnO$_2$, ATO (antimony-doped tin oxide), ZnO, AZO (aluminum-doped zinc oxide), GZO (gallium-doped zinc oxide), TiO$_2$, FTO (fluorine-doped tin oxide), etc., electrically conductive polymers such as PEDOT/PSS (poly(3,4-ethylenedioxythiophene)/polystyrenesulfonate), carbon materials such as carbon nanotube, etc. These electrode materials may be formed into films, for example, by a method such as a vacuum deposition method, sputtering, a solution application method, etc.

The material used for the insulating layer is not limited particularly as long as it has required insulating effect. Examples thereof include inorganic materials such as silicon dioxide, silicon nitride, alumina, etc., and organic materials such as polyester, (PEN (polyethylene naphthalate), PET (polyethylene terephthalate) etc.), polycarbonate, polyimide, polyamide, polyacrylate, epoxy resin, polyparaxylylene resin, novolak resin, PVA (polyvinyl alcohol), PS (polystyrene), etc. These insulating film materials may be formed into films, for example, by a method such as a vacuum deposition method, sputtering, a solution application method, etc.

As for any other configuration about the aforementioned organic TFT, for example, refer to description in JP-A-2009-212389.

[5-3. Amorphous Oxide Semiconductor]

For example, amorphous oxide disclosed in JP-A-2010-186860 may be used for the aforementioned TFT switching elements 42. Here, description will be made on an amorphous oxide containing active layer of a FET transistor disclosed in JP-A-2010-186860. The active layer serves as a channel layer of the FET transistor where electrons or holes move.

The active layer has a configuration containing an amorphous oxide semiconductor. The amorphous oxide semiconductor can be formed into a film at a low temperature. Thus, the amorphous oxide semiconductor is formed preferably on a flexible substrate. The amorphous oxide semiconductor used for the active layer is preferably amorphous oxide containing at least one kind of element selected from a group consisting of In, Sn, Zn and Cd, more preferably amorphous oxide containing at least one kind of element selected from a group consisting of In, Sn and Zn, further preferably amorphous oxide containing at least one kind of element selected from a group consisting of In and Zn.

Specific examples of the amorphous oxide used for the active layer include $In_2O_3$, ZnO, $SnO_2$, CdO, Indium-Zinc-Oxide (IZO), Indium-Tin-Oxide (ITO), Gallium-Zinc-Oxide (GZO), Indium-Gallium-Oxide (IGO), and Indium-Gallium-Zinc-Oxide (IGZO).

It is preferable that a vapor phase film formation method targeting at a polycrystal sinter of the oxide semiconductor is used as a method for forming the active layer. Of vapor phase film formation methods, a sputtering method or a pulse laser deposition (PLD) method is preferred. Further, the sputtering method is preferred in view from mass productivity. For example, the active layer is formed by an RF magnetron sputtering deposition method with a controlled degree of vacuum and a controlled flow rate of oxygen.

The thus formed active layer is confirmed to be an amorphous film by a well-known X-ray diffraction method. The composition ratio of the active layer is obtained by an RBS (Rutherford Backscattering Spectrometry) method.

In addition, the electric conductivity of the active layer is preferably lower than $10^2$ $Scm^{-1}$ and not lower than $10^{-4}$ $Scm^{-1}$, more preferably lower than $10^2$ $Scm^{-1}$ and not lower than $10^{-1}$ $Scm^{-1}$. Examples of the method for adjusting the electric conductivity of the active layer include a known adjusting method using oxygen defect, an adjusting method using a composition ratio, an adjusting method using impurities, and an adjusting method using an oxide semiconductor material.

As for any other configuration about the aforementioned amorphous oxide, for example, refer to description in JP-A-2010-186860.

[5-4. Flexible Material]

It may be considered that aramid, bionanofiber, etc. having properties such as flexibility, low thermal expansion and high strength, which cannot be obtained in existing glass or plastic, are used in a radiological image detection apparatus.

(1) Aramid

A film (or a sheet or a substrate) formed out of aramid which is a flexible material may be used as the insulating substrate 401 of the aforementioned sensor board, the support 101, the circuit board of the control module, or the like. An aramid material has high heat resistance showing a glass transition temperature of 315° C., high rigidity showing a Young's modulus of 10 GPa, and high dimensional stability showing a thermal expansion coefficient of −3 to 5 ppm/° C. Therefore, when a film made from aramid is used, it is possible to easily form a high-quality film for a semiconductor layer or a phosphor layer, as compared with the case where a general resin film is used. In addition, due to the high heat resistance of the aramid material, a transparent electrode material can be cured at a high temperature to have low resistance. Further, it is also possible to deal with automatic mounting with ICs, including a solder reflow step. Furthermore, since the aramid material has a thermal expansion coefficient close to that of ITO (indium tin oxide), a gas barrier film or a glass substrate, warp after manufacturing is small. In addition, cracking hardly occurs. Here, it is preferable to use a halogen-free (in conformity with the requirements of JPCA-ES01-2003) aramid material containing no halogens, in view of reduction of environmental load.

The aramid film may be laminated with a glass substrate or a PET substrate, or may be pasted onto a housing of a device.

High intermolecular cohesion (hydrogen bonding force) of aramid leads to low solubility to a solvent. When the problem of the low solubility is solved by molecular design, an aramid material easily formed into a colorless and transparent thin film can be used preferably. Due to molecular design for controlling the order of monomer units and the substituent species and position on an aromatic ring, easy formation with good solubility can be obtained with the molecular structure kept in a bar-like shape with high linearity leading to high rigidity or dimensional stability of the aramid material. Due to the molecular design, halogen-free can be also achieved.

In addition, an aramid material having an optimized characteristic in an in-plane direction of a film can be used preferably. Tensional conditions are controlled in each step of solution casting, vertical drawing and horizontal drawing in accordance with the strength of the aramid film which varies constantly during casting. Due to the control of the tensional conditions, the in-plane characteristic of the aramid film which has a bar-like molecular structure with high linearity leading to easy occurrence of anisotropic physicality can be balanced.

Specifically, in the solution casting step, the drying rate of the solvent is controlled to make the in-plane thickness-direction physicality isotropic and optimize the strength of the film including the solvent and the peel strength from a casting drum. In the vertical drawing step, the drawing conditions are controlled precisely in accordance with the film strength varying constantly during drawing and the residual amount of the solvent. In the horizontal drawing, the horizontal drawing conditions are controlled in accordance with a change in film strength varying due to heating and controlled to relax the residual stress of the film. By use of such an aramid material, the problem that the aramid film after casting may be curled.

In each of the contrivance for the easiness of casting and the contrivance for the balance of the film in-plane characteristic, the bar-like molecular structure with high linearity peculiar to aramid can be kept to keep the thermal expansion coefficient low. When the drawing conditions during film formation are changed, the thermal expansion coefficient can be reduced further.

(2) Bio-Nanofiber

Components sufficiently small relative to the wavelength of light produce no scattering of the light. Accordingly, a flexible plastic material, or the like, reinforced by nanofibers may be used preferably in the insulating substrate 401 of the aforementioned sensor board, the support 101, the circuit board of the control module, or the like. Of the nanofibers, a composite material (occasionally referred to as bionanofiber) of bacterial cellulose and transparent resin can be used preferably. The bacterial cellulose is produced by bacteria (Acetobacter Xylinum). The bacterial cellulose has a cellulose microfibril bundle width of 50 nm, which is about 1/10 as large as the wavelength of visible light. In addition, the bacterial cellulose is characterized by high strength, high elasticity and low thermal expansion.

When a bacterial cellulose sheet is impregnated with transparent resin such as acrylic resin or epoxy resin and hardened, transparent bionanofiber showing a light transmittance of about 90% in a wavelength of 500 nm while having a high fiber ratio of about 60 to 70% can be obtained. By the bionanofiber, a thermal expansion coefficient (about 3 to 7 ppm) as low as that of silicon crystal, strength (about 460 MPa) as high as that of steel, and high elasticity (about 30 GPa) can be obtained.

As for the configuration about the aforementioned bionanofiber, for example, refer to description in JP-A-2008-34556.

6. Manufacturing Method of X-Ray Image Detection Apparatus

Next, a method of manufacturing an X-ray image detection apparatus 1 efficiently will be described.

The above described phosphor 200 may be preferably formed directly on the surface of the support 101 by a vapor deposition method. By the vapor deposition method, the non-columnar section 25 and the columnar section 200 may be sequentially and continuously formed. Here, an aspect using CsI:Tl will be described by way of an example.

As an outline of the vapor deposition method, under an environment in which the degree of vacuum is 0.01 Pa to 10 Pa, CsI:Tl is heated and vaporized by means of, for example, applying electric current to a resistance heating type crucible, and then the temperature of the support 101 is adjusted to room temperature (20° C.) to 300° C. so as to deposit CsI:Tl on the support.

When the crystal phases of CsI:Tl is formed on the support 101 by the vapor deposition method, an aggregate of indeterminately shaped or substantially spherical crystals of which the diameters are relatively small is formed initially. In conducting the vapor deposition method, it is possible to grow the columnar crystals 20A in succession to the formation of the non-columnar section 25 (fluorescent forming step) by varying at least one condition of the degree of vacuum, the temperature of the support, and the deposition rate (deposition cell temperature).

That is, after the non-columnar section 25 is formed to a predetermined thickness t2, the columnar crystals 20A may be efficiently and uniformly grown by performing at least one of the means of increasing the degree of vacuum, increasing the support temperature, and decreasing the deposition rate. Also, the activation amount of Tl may be varied at the non-columnar section 25 and the columnar section 20.

Although in the example as described here, CsI:Tl is used as a material for any one of the columnar section 20 and the non-columnar section 25, it may be considered to use CsI:Tl in the formation of only the columnar section 20 that highly contributes to the luminous efficiency of the entire scintillator 200 due to its high luminous efficiency and light guide function. In this case, the above described advantages of using CsI:Tl in terms of the emission spectrum and the deterioration with elapse of time due to humidity may be also sufficiently enjoyed.

After the phosphor 200 is formed on the support 101 in the phosphor forming step as described above, the phosphor 200 is sealed on the support 101 through evaporative formation of the protective film 30 using parylene or the like by the same vapor deposition method so as to manufacture the scintillator panel 10. Also, the protective film 30 may not be formed in a case where moisture-proof of the phosphor 200 is secured by any other means.

By bonding the scintillator panel 10 to the photodetector 40, the X-ray image detection apparatus 1 may be obtained. The method of bonding the scintillator panel 10 to the photodetector 40 is not particularly limited, and these two elements may be preferably optically coupled to each other. As for the bonding method of the two elements, any one of a method of directly facing the two elements and then bringing the two elements to be in close contact with each other, and a method of bringing the two elements into close contact with each other via any adhesive layer or a flattening layer may be selected.

As for the method of bringing directly the two elements into close contact with each other, there is a method where the phosphor 200 is formed on the support 101, and then the front end portion side portion in the growth direction of the columnar section 20 of the formed phosphor 200 faces and comes into close contact with the sensor board 400 as a photodetector. In this manner, the two elements are bonded to each other so as to manufacture the X-ray image detection apparatus 1. The surfaces of the two elements do not need to be completely in close contact with each other in the close contact process. Even if unevenness by the crystals exists on the surface of the phosphor 200, the two elements may be optically coupled with each other by disposing them to be overlapped with each other, and the light by conversion of the X-rays in the phosphor 200 may be incident on the sensor board 400.

Also, the front end portion side portion in the growth direction of the columnar crystals 20A of the formed phosphor 200 may be optically coupled with the photodetector 40 by placing the two elements to be opposed to each other via a resin layer. As for the resin layer, a planarization layer that flattens the surface of the phosphor 200, an adhesive layer that brings the two elements 200 into close contact with the photodetector 40 and fixes the two elements to each other, or a matching oil layer made of transparent liquid or gel may be used. There is no particular limitation in the resin that constitutes the resin layer, as long as it may allow the scintillation light emitted from the scintillator 200 to reach the photodetector 40 with little attenuation.

As for the resin that constitutes the planarization layer, polyimide, parylene or the like may be used, and polyimide with a good film-forming property is preferred.

As for the adhesive that constitutes the adhesive layer, an adhesive that is optically transparent to the scintillation light emitted from the phosphor 200 is preferable. For example, a thermoplastic resin, a UV-curable adhesive, a heat curing adhesive, a room temperature setting adhesive, a double-sided adhesive sheet may be used. However, from the viewpoint of not degrading the sharpness of an image, it is preferable to use an adhesive made of a low viscosity epoxy resin since it may form a sufficiently thin adhesive layer with respect to a pixel size of the photodetector 40.

Also, from the viewpoint of sensitivity and image quality, the thickness of the resin layer is preferably 50 µm or less, and more preferably ranges from 5 µm to 30 µm.

The X-ray image detection apparatus 1 may be fabricated very efficiently and easily by the manufacturing method as described above. Also, according to the manufacturing method, there is an advantage in that the phosphors 200 may be conveniently fabricated with many specifications as designed by controlling the degree of vacuum or the temperature of the support.

7. Modified Example

Figure 7:
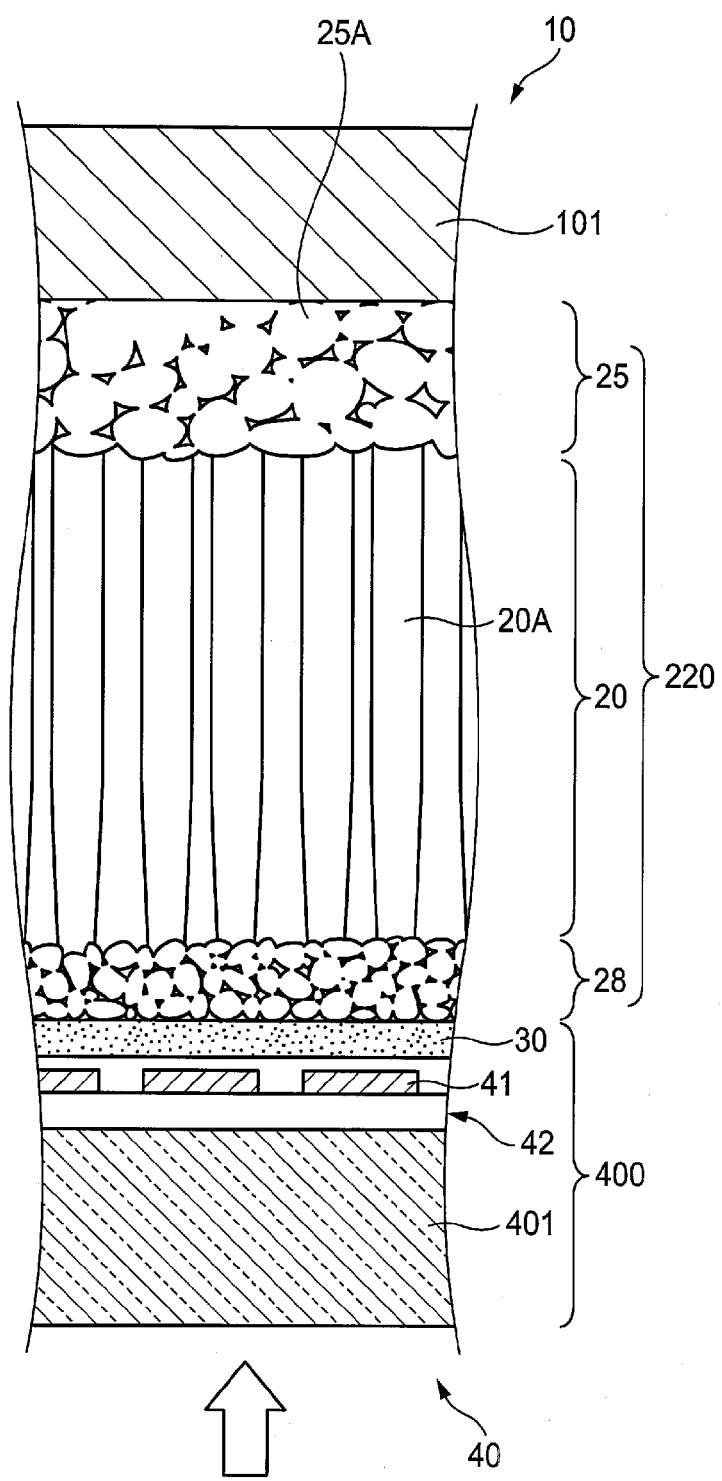
FIG. 7 is a side cross-sectional view schematically illustrating another non-columnar section included in the phosphor in relation to a modified example.

FIG. 7 illustrates a modified example of the above described X-ray image detection apparatus 1. The phosphor 200 illustrated in FIG. 7 includes another non-columnar section 28 arranged on at the sensor board 400 side, in addition to the columnar section 20 and the non-columnar section 25 as described above. The non-columnar section 28 is formed to be thinner than the thickness of the non-columnar section 25. An amorphous portion may also be mixed in the non-columnar section 28.

The porosity of the non-columnar section 28 may be lower than the porosity of the non-columnar section 25 disposed at the support 101 side. As the porosity of the non-columnar section 28 is low and the thickness is thin, the reflection, scattering and attenuation of light in the non-columnar section 28 may be ignored. Since the non-columnar section 28 is provided at the front end portion side of the columnar section 20 to flatten the front end portion of the columnar section 20, the adhesion of the phosphor 220 and the sensor board 400 may be enhanced via the protective film 30. By this, since the external force applied to the phosphor 220, for example, at the time of shock of falling-down may be buffered by the sensor board 400, the shock resistance may be improved. In particular, when the X-ray image detection apparatus 1 is attached to a device case, the phosphor 220 may be hardly damaged even if load from the device case is received.

Also, when there is unevenness in the adhesion with the sensor board 400, unevenness may easily appear in a detection image. However, the quality of the detection image may be uniformized.

Also, by such a non-columnar section 28, it is possible to prevent a material such as parylene from being introduced between the columnar crystals 20A at the time of forming the protective film 30 (FIG. 1). If the parylene or the like is introduced into the pores between the columnar crystals 20A, the difference in refractive index between the columnar crystals 20A and the pores around the columnar crystals 20A is reduced, thereby increasing the critical angle of light. Thus, the light guide performance by the columnar crystals 20A is degraded. By forming the non-columnar section 28, the occurrence of such a problem may be prevented.

8. Manufacturing Examples

Although the present invention is described in more detail below, the present invention but is not limited to specific examples.

Manufacturing Example 1

1. Film-Forming of Scintillator

An alkali-free glass substrate (0.7 mm) for liquid crystals was prepared as the support.

First, surface treatment was performed to the support for the purpose of improving the adhesion with the CsI crystal layer. Then, the surface treated support was set in a vacuum chamber for scintillator film-forming. The vacuum chamber was provided with a plurality of crucibles for independently heating each of the CsI and Tl which are the raw materials of the vacuum chamber. After evacuating the chamber, a predetermined amount of Ar was introduced, thereby setting the degree of vacuum of the device to 0.75 Pa. At the time when the molten state of the raw materials was stabilized by heating the raw material crucibles, the support was concentrically rotated by a device instrument of a vacuum device and a shutter was opened, thereby starting the deposition of the non-columnar section.

Film fabrication was performed at these conditions. When the film thickness of the non-columnar section t2 reached 5 μm, the degree of vacuum was increased to 1 Pa and the vapor deposition of columnar crystals was started. Since the molten state of the raw materials is changed when the degree of vacuum is changed. Thus, the shutter was closed once and it was confirmed that the molten state was stabilized. Then, the shutter was opened again and then vapor deposition was restarted. When the film thickness of the columnar crystals t1 reached 500 μm, the heating of the crucibles was stopped, air intake was made by the vacuum device, and a phosphor including a non-columnar section and a columnar section was formed on the support.

2. Test of Physical Property in Scintillator Layer 2-1. Measurement of Thickness of Non-Columnar Section t2 and Thickness of Columnar Section t1

The film thicknesses were measured by cutting arbitrary portions of the phosphor and observing the side surfaces of the columnar crystals using an SEM (scanning electron micrograph). Among the sampled portions, ten (10) portions were randomly selected and the mean value of measured values was used as the value of the film thickness. The SEM observation of CsI was conducted after sputtering Au about 200 Å due to the non-conductivity.

2-2. Measurement of Crystal Diameters of Non-Columnar Section and Columnar Section The columnar diameters (cross-sectional diameters of columnar crystals) were measured by peeling a part of phosphor off from a support or a light detection substrate in Manufacturing Example 13 to be described below and observing a surface perpendicular to the film thickness direction of the columnar crystals using the SEM (scanning electron micrograph). The observation was performed with a magnification (about 2,000×) that allows 100 to 200 columnar crystals 20A to be observed when the scintillator is viewed from the surface at one shot, and the maximum values of the columnar diameters were measured and an average was taken thereon for all the crystals included at the one shot is employed.

In addition, when crystals are coalescent to each other as in the non-columnar section, the measurement of crystal diameter was performed as follows. A line interconnecting adjacent concave portions (recesses) formed between adjacent non-columnar crystals 25A was considered as a grain boundary between the crystals, the coalescent crystals were separated to be the smallest polygons, and the crystal diameters were measured. Then, columnar diameter (μm) was determined by reading out the measured values to two decimal places and rounding off to one decimal place in accordance with JISZ8401.

When it was difficult to peel off the phosphor from the support, the phosphor was sliced perpendicularly to the crystal growth direction at a position of about 10 μm from the support, an etching was performed using Ar ions to a distance where the shapes in the vicinity of interfaces of CsI crystals adhered to the support may be observed, and then observation was performed on the etched surface. The SEM observation of CsI was conducted after sputtering Au about 200 Å due to the non-conductivity.

2-3. Measurement of Porosity of Non-Columnar Section

For Manufacturing Examples 1 to 11, the porosities of non-columnar sections at the position corresponding to the B-B cross-section of FIG. 4 were measured and indicated in Table 1. The porosities of the non-columnar sections were calculated based on the deposited areas of the non-columnar sections to the supports, the thicknesses of the non-columnar sections, the CsI densities, and the practically measured weights of the scintillators.

3. Fabrication of Radiological Image Detection Apparatus

After preparing a photodetector, a low viscosity epoxy resin adhesive (Araldite 2020 manufactured by Huntsman Corporation) diluted by a solvent was coated on the surface of the photodetector by a spin coating to such an extent that the thickness of the epoxy resin adhesive becomes to 15 μm after the solvent volatilizes. The columnar section side of the obtained phosphor is placed to be opposed to the adhesive layer formed on the photodetector, and then the photodetector and the phosphor were heated to be bonded to each other through the adhesive layer.

Thereafter, an X-ray image detection apparatus of Manufacturing Example 1 was manufactured by bonding a circuit board for driving TFTs and an integrated circuit (IC) for reading out electric charges were adhered to the terminal unit of the photodetector by an anisotropic conductive film, and connecting them to a circuit board for driving control and AD conversion.

Arrangement was made such that radiation is incident from the photodetector side, and the read-out of a radiological image was conducted by controlling a scanning PC connected with the X-ray image detection apparatus through a cable.

4. Test on Radiological Image Detection Apparatus 4-1. Sensitivity

X-rays were used as the radiation. When irradiating X-rays, the photodetector was driven by an electric circuit, the electric charges by photoelectric conversion produced by the scintillator light in a photodiode were read out, the electric charges were amplified by a charge amplifier, and then AD-converted. As such, the quantity of generated electric charges was calculated.

The quantity of read-out charge (noise of a detection system) at the time on non-irradiating X-rays was measured in advance, and a value obtained by subtracting it from the quantity of generated electric charges was determined as the sensitivity. Also, the result is expressed as a relative value when the sensitivity in Manufacturing Example 12 to be described below is 100. The sensitivity of Manufacturing Example 1 was 120.

4-2. MTF (Modulation Transfer Function)

In accordance with IEC Standards, edge images obtained by photographing MTF edges made of W (tungsten) were calculated to obtain an MTF curve. The result was compared to a value of 2 cycle/mm, and is expressed as a relative value when the value of Manufacturing Example 12 is 100.

4-3. Overall Determination

The performance of the radiological image detection apparatus was determined based on the multiplication of the sensitivities and the MTF evaluation results. It is desirable if the multiplication of a sensitivity and an MTF is 120 or more since the difference in performance may be clearly recognized when an image is subject to an sensory evaluation. The overall determination of Manufacturing Example 1 was 120, and for Manufacturing Example 12, it will be appreciated that the sensitivity and the sharpness of an image are excellent.

Manufacturing Example 12

The substrate was changed to the glass substrate used in manufacturing example 1 as the support. The glass substrate was formed with unevenness through wet etching with an about 5 μm pitch and an about 5 μm height on the surface of the glass substrate and used.

In forming the phosphor, the radiological image detection apparatus of Manufacturing Example 12 was manufactured as in Manufacturing Example 1 except that the columnar crystal layer was directly vapor-deposited on the support without performing the vapor deposition of the non-columnar crystal section. Evaluation was made in the same manner with that of Manufacturing Example 1, and relative evaluation was made assuming the result of Manufacturing Example 12 is 100.

Manufacturing Examples 2 to 6

Radiological image detection apparatuses of Fabrication Examples 2 to 6 were manufactured as in Manufacturing Example 1 except that the film thicknesses of the non-columnar crystal sections were adjusted as represented in Table 1 by changing the deposition time when the degree of vacuum was 0.75 Pa, and evaluated in the same manner. The results are represented in Table 1 below.

Manufacturing Examples 7 to 11

Radiological image detection apparatuses of Manufacturing Examples 7 to 11 were manufactured as in Manufacturing Example 1 except that in Manufacturing Example 1, the degree of vacuum was changed to those represented in Table 1, and the crystal diameters at the non-columnar section 25 were prepared as indicated in Table 1, and evaluated in the same manner. The results are represented in Table 1 below.

Manufacturing Example 13

The support was changed to the glass substrate used in Manufacturing Example 3 and phosphor was directly formed by fabricating a film under the same conditions with those in Manufacturing Example 3. In the present aspect, the non-columnar section in the vicinity of the photodetector was formed first and then the columnar section was formed. The bonding by a thermosetting adhesive is not performed. The processings except this were performed as in Manufacturing Example 3.

TABLE 1

| | | Phosphor Film Forming Method | | Phosphor Shape | | | | | | | | |
|---|---|---|---|---|---|---|---|---|---|---|---|---|
| | | Degree of vacuum | | Non-columnar diameter | | | Columnar diameter | | Film | Evaluation result | | |
| | Support | Non-columnar section | Columnar section | Film thickness $t_2$ | Mean crystal diameter | Porosity (%) | Film thickness $t_1$ | Mean columnar diameter | thickness ratio $t_2/t_1$ | Sensitivity | MTF | Overall Determination |
| Manufacturing Example 1 | Alkali-free glass | 0.75 Pa | 1 Pa | 5 | 3.3 | 9.0 | 500 | 7.6 | 0.01 | 120 | 100 | 120 |
| Manufacturing Example 2 | Alkali-free glass | 0.75 Pa | 1 Pa | 10 | 3.0 | 9.2 | 500 | 7.2 | 0.02 | 121 | 100 | 121 |
| Manufacturing Example 3 | Alkali-free glass | 0.75 Pa | 1 Pa | 25 | 3.0 | 9.0 | 500 | 6.8 | 0.05 | 123 | 101 | 124 |

TABLE 1-continued

| | | Phosphor Film Forming Method | | Phosphor Shape | | | | | | Evaluation result | | |
| | | Degree of vacuum | | Non-columnar diameter | | | Columnar diameter | | Film | | | |
| | Support | Non-columnar section | Columnar section | Film thickness t2 | Mean crystal diameter | Porosity (%) | Film thickness t1 | Mean columnar diameter | thickness ratio t2/t1 | Sensitivity | MTF | Overall Determination |
|---|---|---|---|---|---|---|---|---|---|---|---|---|
| Manufacturing Example 4 | Alkali-free glass | 0.75 Pa | 1 Pa | 50 | 3.1 | 9.1 | 500 | 7.2 | 0.10 | 122 | 100 | 122 |
| Manufacturing Example 5 | Alkali-free glass | 0.75 Pa | 1 Pa | 125 | 3.4 | 9.3 | 500 | 7.1 | 0.25 | 120 | 100 | 120 |
| Manufacturing Example 6 | Alkali-free glass | 0.75 Pa | 1 Pa | 170 | 3.2 | 9.3 | 500 | 7.0 | 0.34 | 121 | 94 | 114 |
| Manufacturing Example 7 | Alkali-free glass | 0.1 Pa | 1 Pa | 25 | 11.2 | 4.0 | 500 | 6.8 | 0.05 | 111 | 91 | 101 |
| Manufacturing Example 8 | Alkali-free glass | 0.3 Pa | 1 Pa | 25 | 8.0 | 7.0 | 500 | 7.0 | 0.05 | 117 | 99 | 116 |
| Manufacturing Example 9 | Alkali-free glass | 0.5 Pa | 1 Pa | 25 | 6.2 | 8.8 | 500 | 7.0 | 0.05 | 123 | 100 | 123 |
| Manufacturing Example 10 | Alkali-free glass | 1.5 Pa | 1 Pa | 25 | 1.5 | 9.4 | 500 | 7.2 | 0.05 | 122 | 100 | 122 |
| Manufacturing Example 11 | Alkali-free glass | 3 Pa | 1 Pa | 25 | 0.5 | 9.3 | 500 | 7.0 | 0.05 | 122 | 100 | 122 |
| Manufacturing Example 12 | Patterning substrate | — | 1 Pa | — | — | — | 500 | 6.8 | — | 100 | 100 | 100 |
| Manufacturing Example 13 | Photodetector (TFT) substrate | 0.75 Pa | 1 Pa | 25 | 3.1 | 9.0 | 500 | 6.9 | 0.05 | 98 | 96 | 94 |

In addition, the unit of each of film thickness, mean crystal diameter and mean columnar diameter represented in Table 1 is μm.

As clear from Table 1, it will be appreciated that the radiological image detection apparatuses of Manufacturing Examples 1 to 11 of the present invention are highly sensitive and the deterioration of an image such as image burr is suppressed so that the sharpness of an obtained image is high, as compared to Manufacturing Example 12 in which the phosphor is entirely formed by columnar crystals.

Meanwhile, in Manufacturing Example 13 that includes the non-columnar section in the vicinity of the photodetector side, it will be appreciated that it is impossible to obtain a sufficient sensitivity due to the degradation of scattering and luminescence efficiencies in the non-columnar section.

Here, concerning the porosity of the non-columnar section, Manufacturing Example 7 of which the porosity is 4% is inferior to other fabrication examples in both of sensitivity and MTF and does not also have the high levels of Manufacturing Example 1 or the like in overall determination. In addition, Manufacturing Example 8 of which the porosity is 7% gives indication of performance degradation in relation to both of sensitivity and MTF but not to the extent of Manufacturing Example 7. It is believed that in Fabrications 7 and 8, the porosity is reduced and the reflection effect is deteriorated since crystals are bonded to each other to be enlarged in diameter, and thus, the sensitivity and MTF are reduced. In addition, it is believed that Manufacturing Example 6 receives the overall determination since MTF is reduced due to the reason that the film thickness of the non-columnar section t2 is too thick.

From Manufacturing Examples 1 to 11, it will be appreciated that the suitable range of the porosity of the non-columnar section is more than 7% and not more than 10%. The range of diameter in the non-columnar section corresponding to the range of the porosity is 0.5 μm or more and 7.0 μm or less.

Disclosure of Present Description

As described above, the present description discloses a radiological image detection apparatus comprising: a scintillator panel including a phosphor that is formed on a support and emits fluorescence by irradiation of radiation; and a photodetector that detects the fluorescence emitted by the phosphor as an electric signal, in which the phosphor includes a columnar section formed by growing crystals of a fluorescent material in a columnar shape, and a non-columnar section provided between the columnar section and the support and having a porosity lower than that of the columnar section, and in which the scintillator panel is disposed at a rear side of the photodetector in a radiation travelling direction, and the non-columnar section is disposed at a side opposite to the photodetector side in the phosphor.

And, in the disclosed radiological image detection apparatus, the crystals of the fluorescent material in the non-columnar section includes a group of substantially spherical or indeterminate shape, and at least some of the crystals included in the non-columnar section are fused to each other in an in-plane direction crossing a thickness direction of the non-columnar section at right angles.

And, in the disclosed radiological image detection apparatus, a porosity of the non-columnar section is 10% or less.

And, in the disclosed radiological image detection apparatus, a porosity of a portion in the non-columnar section which adjoins the support is 0 or substantially 0.

And, in the disclosed radiological image detection apparatus, a diameter of a non-columnar crystal included in the non-columnar section is smaller than that of a columnar crystal included in the columnar section.

And, in the disclosed radiological image detection apparatus, the diameter of the non-columnar crystal included in the non-columnar section is not less than 0.5 μm and not more than 7.0 μm.

And, in the disclosed radiological image detection apparatus, a thickness of the non-columnar section from a surface of the support is not thinner than 5 μm or more and not thicker than 125 μm.

And, in the disclosed radiological image detection apparatus, a porosity of the non-columnar section has a gradient in a thickness direction of the non-columnar section from a surface of the support.

And, in the disclosed radiological image detection apparatus, in the columnar section and the non-columnar section, at least the columnar section is formed to include CsI and Tl.

And, in the disclosed radiological image detection apparatus, in the phosphor further includes another non-columnar section at a side opposite to the side where the non-columnar section is provided.

And, in the disclosed radiological image detection apparatus, a control unit that drives and controls the photodetector is provided at a side opposite to a radiation entrance side of the scintillator.

And, in the disclosed radiological image detection apparatus, the radiological image detection apparatus is configured as a portable cassette.

And, in the disclosed radiological image detection apparatus, the phosphor is formed on the support by a vapor deposition method.

And, the present description discloses a method of manufacturing the radiological image detection apparatus, comprising: depositing the crystals of the fluorescent material by a vapor deposition method to form the columnar section and the non-columnar section of the phosphor on the support; and changing at least one condition among the conditions of degree of vacuum, temperature of the support and deposition rate at the time of forming the columnar section to form the non-columnar section.

And, in the disclosed method of manufacturing the radiological image detection apparatus, a front end side portion of the formed phosphor in the deposition direction of the columnar section and the photodetector are placed to be opposed to each other and to be in close contact with each other.

And, in the disclosed method of manufacturing the radiological image detection apparatus, a front end side portion of the formed phosphor in the deposition direction of the columnar section and the photodetector are placed to be opposed to each other through a resin layer to be optically coupled to each other.

Although the present invention has been described in detail or with reference to specific exemplary embodiments, it is apparent to a person skilled in the art that various changes or modifications may be made without departing from the idea and scope of the present invention. The present application is based on Japanese Patent Application No. 2010-291388 filed on Dec. 27, 2010, the contents of which are incorporated herein by reference.

INDUSTRIAL APPLICABILITY

The present invention may detect a radiological image with high sensitivity and high definition. Thus, the present invention may be used in a state where it is mounted within various devices such as an X-ray imaging device for medical use such as a mammography that requires the detection of a sharp image at a low radiation irradiation dose. For example, since the present invention may be used as, for example, an X-ray imaging device for industrial use for a non-destructive test, or as a device for detecting corpuscular beams (α rays, β-rays, γ rays) besides electromagnetic waves, the application range of the present invention is wide.

REFERENCE SIGNS LIST

1: X-ray image detection apparatus (radiological image detection apparatus)
10: scintillator panel
101: support
200: phosphor
20: columnar section
20A: columnar crystal
25: non-columnar section
25A: non-columnar crystal
30: protective film
40: photodetector
400: sensor board
50: control module

The invention claimed is:

1. A radiological image detection apparatus comprising:
a scintillator panel including a phosphor that is formed on a support and emits fluorescence by irradiation of radiation; and
a photodetector that detects the fluorescence emitted by the phosphor as an electric signal,
wherein the phosphor includes a columnar section formed by growing crystals of a fluorescent material in a columnar shape, and a non-columnar section provided between the columnar section and the support and having a porosity lower than that of the columnar section, and
wherein the scintillator panel is disposed at a rear side of the photodetector in a radiation travelling direction, and the non-columnar section is disposed at a side opposite to the photodetector side in the phosphor.

2. The radiological image detection apparatus of claim 1, wherein the crystals of the fluorescent material in the non-columnar section includes a group of substantially spherical or indeterminate shape, and
at least some of the crystals included in the non-columnar section are fused to each other in an in-plane direction crossing a thickness direction of the non-columnar section at right angles.

3. The radiological image detection apparatus of claim 1, wherein a porosity of the non-columnar section is 10% or less.

4. The radiological image detection apparatus of claim 1, wherein a porosity of a portion in the non-columnar section which adjoins the support is 0 or substantially 0.

5. The radiological image detection apparatus of claim 1, wherein a diameter of a non-columnar crystal included in the non-columnar section is smaller than that of a columnar crystal included in the columnar section.

6. The radiological image detection apparatus of claim 5, wherein the diameter of the non-columnar crystal included in the non-columnar section is not less than 0.5 μm and not more than 7.0 μm.

7. The radiological image detection apparatus of claim 1, wherein a thickness of the non-columnar section from a surface of the support is not thinner than 5 μm or more and not thicker than 125 μm.

8. The radiological image detection apparatus of claim 1, wherein a porosity of the non-columnar section has a gradient in a thickness direction of the non-columnar section from a surface of the support.

9. The radiological image detection apparatus of claim 1, wherein in the columnar section and the non-columnar section, at least the columnar section is formed to include CsI and Tl.

10. The radiological image detection apparatus of claim 1, wherein in the phosphor further includes another non-columnar section at a side opposite to the side where the non-columnar section is provided.

11. The radiological image detection apparatus of claim 1, wherein a control unit that drives and controls the photodetector is provided at a side opposite to a radiation entrance side of the scintillator.

12. The radiological image detection apparatus of claim 1, wherein the radiological image detection apparatus is configured as a portable cassette.

13. The radiological image detection apparatus of claim 1, wherein the phosphor is formed on the support by a vapor deposition method.

14. A method of manufacturing the radiological image detection apparatus of claim 1, comprising:
depositing the crystals of the fluorescent material by a vapor deposition method to form the columnar section and the non-columnar section of the phosphor on the support; and
changing at least one condition among the conditions of degree of vacuum, temperature of the support and deposition rate at the time of forming the columnar section to form the non-columnar section.

15. The method of manufacturing the radiological image detection apparatus of claim 14, wherein a front end side portion of the formed phosphor in the deposition direction of the columnar section and the photodetector are placed to be opposed to each other and to be in close contact with each other.

16. The method of manufacturing the radiological image detection apparatus of claim 14, wherein a front end side portion of the formed phosphor in the deposition direction of the columnar section and the photodetector are placed to be opposed to each other through a resin layer to be optically coupled to each other.

17. A radiological image detection apparatus comprising:
a scintillator panel including a phosphor that is formed on a support and emits fluorescence by irradiation of radiation; and
a photodetector that detects the fluorescence emitted by the phosphor as an electric signal,
wherein the phosphor includes a columnar section formed by growing crystals of a fluorescent material in a columnar shape, and a non-columnar section provided between the columnar section and the support and having a porosity lower than that of the columnar section,
wherein the porosity of the non-columnar section has a gradient in a thickness direction of the non-columnar section from a surface of the support, and
the porosity of the non-columnar section at the columnar-section side is higher than the porosity of the non-columnar section at the support side, and
the porosity of a portion in the non-columnar section which adjoins the support is 0 or substantially 0, and
wherein the photodetector and the scintillator are arranged in order from an entrance side of the radiation being emitted from a radiation source at the time of shooting and
the non-columnar section is disposed at a side opposite to the photodetector side in the phosphor.

18. The radiological image detection apparatus of any of claim 17, wherein in the columnar section and the non-columnar section, at least the columnar section is formed to include CsI and Tl.

19. The radiological image detection apparatus of claim 17, wherein the radiological image detection apparatus is configured as a portable cassette.

* * * * *